US009431473B2

(12) United States Patent
Lo et al.

(10) Patent No.: US 9,431,473 B2
(45) Date of Patent: Aug. 30, 2016

(54) HYBRID TRANSFORMER STRUCTURE ON SEMICONDUCTOR DEVICES

(71) Applicant: Qualcomm Incorporated, San Diego, CA (US)

(72) Inventors: Chi Shun Lo, San Diego, CA (US); Je-Hsiung Lan, San Diego, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/684,103

(22) Filed: Nov. 21, 2012

(65) Prior Publication Data

US 2014/0138792 A1 May 22, 2014

(51) Int. Cl.
*H01L 27/08* (2006.01)
*H01L 21/337* (2006.01)
(Continued)

(52) U.S. Cl.
CPC ............... *H01L 28/10* (2013.01); *H01F 19/04* (2013.01); *H01F 21/00* (2013.01);
(Continued)

(58) Field of Classification Search
CPC . H01L 23/5227; H01L 23/52; H01L 23/522; H01L 2224/48091; H01L 2224/47; H01L 2224/4805; H01L 41/041; H01F 41/27; H01F 41/127; H01F 41/37; H01F 41/04; H01F 41/005; H01F 41/004
USPC .................... 333/25, 32; 336/200, 205, 222; 257/531, 528 M, E21.922, 528; 438/171, 190, 210
See application file for complete search history.

(56) References Cited

U.S. PATENT DOCUMENTS 3,798,059 A    3/1974   Astle et al.
4,815,128 A *   3/1989   Malek ........................... 713/153
(Continued)

FOREIGN PATENT DOCUMENTS

CN     102522181 A    6/2012
CN     203942319 U    11/2014
(Continued)

OTHER PUBLICATIONS

Chien-Hsun Chen et al., "Very Compact Transformer-Coupled Balun-Integrated Bandpass Filter Using Integrated Passive Device Technology on Glass Substrate", Microwave Symposium Digest (MTT), 2010 IEEE MTT-S International, May 23-28, 2010, pp. 1372-1375.
(Continued)

*Primary Examiner* — Nikolay Yushin
(74) *Attorney, Agent, or Firm* — Kenneth K. Vu; Paul Holdaway

(57) ABSTRACT

Several novel features pertain to a hybrid transformer formed within a semiconductor die having multiple layers. The hybrid transformer includes a first set of windings positioned on a first layer of the die. The first layer is positioned above a substrate of the die. The first set of windings includes a first port and a second port. The first set of windings is arranged to operate as a first inductor. The hybrid transformer includes a second set of windings positioned on a second layer of the die. The second layer is positioned above the substrate. The second set of windings includes a third port, a fourth port and a fifth port. The second set of windings is arranged to operate as a second inductor and a third inductor. The first set of windings and the second set of windings are arranged to operate as a vertical coupling hybrid transformer.

48 Claims, 17 Drawing Sheets

(51) Int. Cl.

| | | |
|---|---|---|
| *H01F 27/30* | (2006.01) | |
| *H01L 49/02* | (2006.01) | |
| *H01F 21/00* | (2006.01) | |
| *H01F 19/04* | (2006.01) | |
| *H01L 23/522* | (2006.01) | |
| *H01L 23/64* | (2006.01) | |
| *H01F 19/08* | (2006.01) | |
| *H01F 27/28* | (2006.01) | |

(52) U.S. Cl.
CPC ........ *H01L 23/5227* (2013.01); *H01L 23/645* (2013.01); *H01F 2019/085* (2013.01); *H01F 2027/2809* (2013.01); *H01L 2924/0002* (2013.01); *Y10T 29/41* (2015.01)

(56) References Cited

U.S. PATENT DOCUMENTS

| | | | |
|---|---|---|---|
| 4,816,784 A * | 3/1989 | Rabjohn | 333/24 R |
| 4,841,253 A | 6/1989 | Crabill | |
| 5,015,972 A * | 5/1991 | Cygan et al. | 333/32 |
| 5,038,104 A | 8/1991 | Wikswo, Jr. et al. | |
| 5,095,357 A * | 3/1992 | Andoh et al. | 257/379 |
| 5,111,169 A | 5/1992 | Ikeda | |
| 5,161,082 A | 11/1992 | Alfonso | |
| 5,719,073 A | 2/1998 | Shaw et al. | |
| 5,831,331 A | 11/1998 | Lee | |
| 5,959,846 A | 9/1999 | Noguchi et al. | |
| 5,986,617 A | 11/1999 | McLellan | |
| 6,025,261 A | 2/2000 | Farrar et al. | |
| 6,169,470 B1 | 1/2001 | Ibata et al. | |
| 6,429,763 B1 | 8/2002 | Patel et al. | |
| 6,437,965 B1 | 8/2002 | Adkins et al. | |
| 6,501,363 B1 | 12/2002 | Hwu et al. | |
| 6,580,350 B1 | 6/2003 | Kobayashi | |
| 6,603,382 B1 | 8/2003 | Komai et al. | |
| 6,649,998 B2 | 11/2003 | Song | |
| 6,714,112 B2 | 3/2004 | Beng et al. | |
| 6,801,114 B2 * | 10/2004 | Yang et al. | 336/200 |
| 6,816,784 B1 | 11/2004 | Khan et al. | |
| 6,870,457 B2 * | 3/2005 | Chen et al. | 336/200 |
| 6,985,035 B1 | 1/2006 | Khorramabadi | |
| 7,064,411 B2 | 6/2006 | Hashizume et al. | |
| 7,304,558 B1 | 12/2007 | Pleskach et al. | |
| 7,312,685 B1 | 12/2007 | Lee | |
| 7,370,403 B1 | 5/2008 | Hsu et al. | |
| 7,486,168 B2 | 2/2009 | Kim | |
| 7,526,256 B2 * | 4/2009 | Bhatti et al. | 455/73 |
| 7,570,129 B2 | 8/2009 | Kintis et al. | |
| 7,592,891 B2 | 9/2009 | Hsu et al. | |
| 7,616,934 B2 | 11/2009 | Macphail | |
| 7,619,297 B2 | 11/2009 | Wang | |
| 7,808,358 B2 | 10/2010 | Nakamura et al. | |
| 7,894,205 B2 | 2/2011 | Lee et al. | |
| 8,013,708 B2 | 9/2011 | Tsai | |
| 8,045,946 B2 | 10/2011 | Roo et al. | |
| 8,229,367 B2 | 7/2012 | Chan et al. | |
| 8,233,870 B2 | 7/2012 | Walley et al. | |
| 8,339,233 B2 | 12/2012 | Tsai et al. | |
| 8,354,325 B1 | 1/2013 | Dao et al. | |
| 8,368,481 B2 | 2/2013 | Jin et al. | |
| 8,493,126 B2 | 7/2013 | Sankaranarayanan et al. | |
| 8,591,262 B2 | 11/2013 | Schaffer et al. | |
| 9,001,031 B2 | 4/2015 | Lo et al. | |
| 2002/0057176 A1 | 5/2002 | Norstrom et al. | |
| 2002/0113682 A1 * | 8/2002 | Gevorgian et al. | 336/200 |
| 2002/0132383 A1 | 9/2002 | Hiroki et al. | |
| 2003/0151485 A1 | 8/2003 | Lewis | |
| 2004/0012474 A1 * | 1/2004 | Hwu et al. | 336/200 |
| 2004/0090298 A1 | 5/2004 | Masu et al. | |
| 2004/0150502 A1 * | 8/2004 | Jacobson et al. | 336/200 |
| 2004/0207504 A1 * | 10/2004 | Yang et al. | 336/223 |
| 2005/0104158 A1 | 5/2005 | Bhattacharjee et al. | |
| 2006/0017539 A1 | 1/2006 | Lee et al. | |
| 2006/0284719 A1 | 12/2006 | Lee | |
| 2007/0008058 A1 | 1/2007 | Hashimoto | |
| 2007/0030116 A1 | 2/2007 | Feher | |
| 2007/0152298 A1 | 7/2007 | Kim | |
| 2007/0176845 A1 | 8/2007 | Yamazaki et al. | |
| 2007/0188997 A1 | 8/2007 | Hockanson et al. | |
| 2007/0247269 A1 * | 10/2007 | Papananos | 336/200 |
| 2007/0249078 A1 | 10/2007 | Tung et al. | |
| 2008/0037590 A1 | 2/2008 | Aiga et al. | |
| 2008/0076354 A1 | 3/2008 | Rofougaran | |
| 2008/0169895 A1 | 7/2008 | Lee | |
| 2008/0174396 A1 | 7/2008 | Choi et al. | |
| 2008/0174397 A1 | 7/2008 | De Rooij et al. | |
| 2008/0246114 A1 | 10/2008 | Abrokwah et al. | |
| 2008/0272875 A1 * | 11/2008 | Huang et al. | 336/182 |
| 2008/0303622 A1 | 12/2008 | Park et al. | |
| 2009/0001510 A1 | 1/2009 | Matz et al. | |
| 2009/0085708 A1 | 4/2009 | Matsumoto et al. | |
| 2009/0146770 A1 | 6/2009 | Lee et al. | |
| 2009/0243389 A1 | 10/2009 | Edo et al. | |
| 2009/0243749 A1 * | 10/2009 | Rofougaran | 333/25 |
| 2009/0322447 A1 | 12/2009 | Daley et al. | |
| 2010/0060402 A1 | 3/2010 | Chen | |
| 2010/0096753 A1 | 4/2010 | Hwang et al. | |
| 2010/0109123 A1 | 5/2010 | Strzalkowski et al. | |
| 2010/0148866 A1 | 6/2010 | Lee et al. | |
| 2010/0164667 A1 * | 7/2010 | Ho-Hsiang | 336/137 |
| 2010/0182118 A1 | 7/2010 | Roskos et al. | |
| 2010/0225435 A1 | 9/2010 | Li et al. | |
| 2010/0231305 A1 | 9/2010 | Mizokami et al. | |
| 2010/0270947 A1 * | 10/2010 | Chang et al. | 315/294 |
| 2011/0018670 A1 | 1/2011 | Bae et al. | |
| 2011/0050357 A1 | 3/2011 | Kim et al. | |
| 2011/0102124 A1 | 5/2011 | Matsushita | |
| 2011/0133875 A1 | 6/2011 | Chiu et al. | |
| 2011/0133879 A1 | 6/2011 | Chiu et al. | |
| 2011/0168997 A1 | 7/2011 | Lee et al. | |
| 2011/0217657 A1 | 9/2011 | Flemming et al. | |
| 2011/0221560 A1 | 9/2011 | Chen et al. | |
| 2011/0229667 A1 | 9/2011 | Jin et al. | |
| 2011/0229687 A1 | 9/2011 | Gu et al. | |
| 2011/0245948 A1 | 10/2011 | Bai et al. | |
| 2011/0291786 A1 | 12/2011 | Li et al. | |
| 2011/0299435 A1 | 12/2011 | Mikhemar et al. | |
| 2011/0304013 A1 | 12/2011 | Chen et al. | |
| 2012/0075216 A1 | 3/2012 | Black et al. | |
| 2012/0146741 A1 * | 6/2012 | Yen et al. | 333/25 |
| 2012/0188047 A1 | 7/2012 | Groves et al. | |
| 2012/0194403 A1 * | 8/2012 | Cordier et al. | 343/853 |
| 2012/0235779 A1 | 9/2012 | Baram et al. | |
| 2012/0235969 A1 | 9/2012 | Burns et al. | |
| 2012/0238331 A1 | 9/2012 | Dou et al. | |
| 2012/0244802 A1 | 9/2012 | Feng et al. | |
| 2012/0249186 A1 | 10/2012 | Chen | |
| 2012/0249281 A1 | 10/2012 | Campbell et al. | |
| 2012/0293485 A1 | 11/2012 | Chang et al. | |
| 2012/0299166 A1 | 11/2012 | Minamio et al. | |
| 2013/0016633 A1 | 1/2013 | Lum et al. | |
| 2013/0039229 A1 | 2/2013 | Park et al. | |
| 2013/0050226 A1 | 2/2013 | Shenoy et al. | |
| 2013/0057343 A1 | 3/2013 | Kondo | |
| 2013/0106554 A1 | 5/2013 | Girard et al. | |
| 2013/0207276 A1 | 8/2013 | Tseng et al. | |
| 2013/0207739 A1 | 8/2013 | Bakalski | |
| 2013/0207745 A1 | 8/2013 | Yun et al. | |
| 2013/0257367 A1 | 10/2013 | Someya | |
| 2013/0278374 A1 | 10/2013 | Thorslund | |
| 2014/0145810 A1 | 5/2014 | Park et al. | |
| 2014/0197902 A1 | 7/2014 | Zuo et al. | |
| 2014/0225702 A1 | 8/2014 | Yazaki | |
| 2014/0227982 A1 | 8/2014 | Granger-Jones et al. | |
| 2014/0240072 A1 | 8/2014 | Lan et al. | |
| 2014/0266494 A1 | 9/2014 | Lan et al. | |
| 2014/0293841 A1 | 10/2014 | Rousu | |
| 2014/0327510 A1 | 11/2014 | Kim et al. | |
| 2015/0061813 A1 | 3/2015 | Kim et al. | |
| 2015/0092314 A1 | 4/2015 | Kim | |
| 2015/0130579 A1 | 5/2015 | Kim et al. | |

(56) References Cited

U.S. PATENT DOCUMENTS

FOREIGN PATENT DOCUMENTS

| | | | |
|---|---|---|---|
| EP | 0468757 | A2 | 1/1992 |
| EP | 0995264 | A1 | 4/2000 |
| EP | 1085538 | A1 | 3/2001 |
| EP | 1729413 | A1 | 12/2006 |
| JP | 2002152901 | A | 5/2002 |
| JP | 2005032976 | A | 2/2005 |
| KR | 101127478 | B1 | 3/2012 |
| KR | 20130072284 | A | 7/2013 |
| KR | 20130098099 | A | 9/2013 |
| WO | WO-02080279 | A1 | 10/2002 |

OTHER PUBLICATIONS

Fu et al., "A Ferroelectric-Based Impedance Tuner for Adaptive Matching Applications", Microwave Symposium Digest, 2008 IEEE MTT-S International, Jun. 15-20, 2008, pp. 955-958.

Mikhemar, et al., "An On-Chip Wideband and Low-Loss Duplexer for 3G/4G CMOS Radios," IEEE Symposium on VLSI Circuits 2010, pp. 129-130.

International Search Report and Written Opinion—PCT/US2013/071349—ISA/EPO—Feb. 24, 2014.

Mikhemar M. et al., "A tunable integrated duplexer with 50dB isolation in 40nm CMOS", IEEE International Solid-State Circuits Conference (ISSCC)—Digest Of Technical Papers, Feb. 8, 2009, IEEE, Piscataway, NJ, USA, pp. 386-387, 387a, XP031742309, ISBN: 978-1-4244-3458-9.

Yoon Y. et al., "Design and Characterization of Multilayer Spiral Transmission-Line Baluns", IEEE Transactions on Microwave Theory and Techniques, Sep. 1, 1999, IEEE Service Center, Piscataway, NJ, US, vol. 47, No. 9, pp. 1841-1847, XP011037747, ISSN: 0018-9480.

Mobley, T., et al., "Through glass via (TGV) solutions for wafer and chip level interposers and RF integration methods for high frequency applications," Mar. 2012, 25 pages.

Orlandi S., et al., "Optimization of shielded PCB air-core toroids for high efficiency dc-dc converters," Energy Conversion Congress and Exposition, Sep. 2009, pp. 2073-2080.

Shorey, A., et al., "Development of Substrates Featuring Through Glass Vias (TGV) for 3D-IC Integration," pp. 1-3.

Taiwan Search Report—TW102142516—TIPO—Sep. 29, 2014.

Topper M. et al., "3-D Thin film interposer based on TGV (Through Glass Vias): An alternative to Si-interposer", Electronic Components and Technology Conference (ECTC), 2010 Proceedings 60th, IEEE, Piscataway, NJ, USA, Jun. 1, 2010, pp. 66-73, XP031694110, ISBN: 978-1-4244-6410-4.

Yu X., et al., "Silicon-Embedding Approaches to 3-D Toroidal Inductor Fabrication," Journal of Microelectromechanical Systems, Jun. 2013, vol. 22 (3), pp. 580-588.

Bae H., et al., "Extraction of Separated Source and Drain Resistances in Amorphous Indium—Gallium—Zinc Oxide TFTs Through C-V Characterization", IEEE Electron Device Letters, Jun. 2011, vol. 32, No. 6, pp. 761-763.

Saputra N., et al., "Single-Grain Si Thin-Film Transistors for Analog and RF Circuit Applications"Solid State Device Research Conference, ESSDERC 2007, 37th Europea, Sep. 11-13, 2007, pp. 107-110.

\* cited by examiner

Unbalanced Configuration

HYBRID TRANSFORMER STRUCTURE ON SEMICONDUCTOR DEVICES

BACKGROUND

1. Field

Various features relate to a vertical coupling hybrid transformer structure on semiconductor devices.

2. Background

A transformer is a device that transfers electrical energy from one circuit to another circuit through inductors, which are typically coils and/or windings. A hybrid transformer is a specific type of transformer that allows energy/power to be split in any desired proportion between two sets of receiving ports. That is, energy/power from one set of ports from a first circuit can be transferred to two different sets of receiving ports from a second circuit, or vice versa.

A hybrid transformer has several properties and may perform several functions. For example, a hybrid transformer provides bi-conjugacy between alternate set of ports, impedance matching at each port, the ability to spilt power in any desired proportion between two receiving ports, and 180 degree phase inversion of signals.

A hybrid transformer may have a balanced configuration or an unbalanced configuration. In a balanced configuration, the split of the energy/power is more evenly distributed between the two sets of ports, while in an unbalanced configuration, the split of the energy/power is biased towards one set of ports.

FIG. 1A illustrates a circuit diagram of an example of a hybrid transformer 100 found in the prior art. As shown in FIG. 1A, the hybrid transformer 100 includes a first coil 102, a first port 104 and a second port 106. The first port 104 is connected to a first capacitor and the second port 106 is connected to a second capacitor. The hybrid transformer 100 also includes a second coil 108, a third coil 110, a third port 112, a fourth port 114, and a fifth port 116. The third port 112 is connected to a replica port, the fourth port 114 is connected to a power amplifier (PA), and the fifth port is connected to an antenna.

A hybrid transformer may have insertion loss and isolation properties. FIG. 1B conceptually illustrates the various loss and isolation of a hybrid transformer in a balanced configuration. There are two types of insertion loss, a TX-ANT loss (Transmitter Antenna loss) and ANT-RX loss (Antenna Receiver loss). TX-ANT loss refers to loss from the fourth port 114 to the fifth port 116 (e.g., from PA to Antenna), The ANT-RX loss refers to the loss from the fifth port 116 to the second port 106 (e.g., from Antenna to LNA circuit). As shown in FIG. 1B, the hybrid transformer also has TX-RX isolation/leakage.

FIG. 1C conceptually illustrates the various loss and isolation of a hybrid transformer in an unbalanced configuration. As shown in FIG. 1C, the TX-ANT loss is lower in the unbalanced configuration than in the balanced configuration (as illustrated by the thicker arrow). However, the ANT-RX loss is higher in the unbalanced configuration than the balanced configuration (also illustrated by the dotted-line arrow). Different hybrid transformers will have different loss and isolation properties.

FIG. 2 illustrates a top view diagram of a lateral coupling hybrid transformer. As shown in FIG. 2, the hybrid transformer 200 includes a first set of windings 202 and a second set of windings 204. The first set of windings includes a first port 206 and a second port 208. The first set of windings 202 also includes a first set of interconnects 210. The second set of windings 204 includes a third port 212, a fourth port 214 and a fifth port 216. Also, the second set of windings 204 includes a second set of interconnects 218.

As shown in FIG. 2, the first set of windings 202 and the second set of windings 204 are located on one layer of a die. When the first set of windings 202 and the second set of windings 204 are on one layer, then lateral coupling occurs. That is, energy transfers within the same layer of the die. Major drawbacks of lateral coupling includes (i) small coupling coefficient between the first set and the second set of windings (or adjacent inductors) due to the winding spacing and metal thickness by the process limitation, and (ii) the windings take up a relatively large area. In addition, because only one layer is used, the set of windings used are asymmetrical to each other.

Therefore, there is a need for an improved hybrid transformer. Specifically, there is a need for an improved hybrid transformer that utilizes novel technology, or explores a new hybrid transformer device structure using a disruptive process technology.

SUMMARY

Various features apparatus and methods described herein provide a vertical coupling hybrid transformer.

A first example provides a hybrid transformer formed within a semiconductor die having multiple layers. The hybrid transformer includes a first set of windings and a second set of windings. The first set of windings is positioned on at least a first layer of the die. The first layer is positioned above a substrate of the die. The first set of windings includes a first port and a second port. The first set of windings is arranged to operate as a first inductor. The second set of windings is positioned on at least a second layer of the die. The second layer is positioned above the substrate. The second set of windings includes a third port, a fourth port and a fifth port. The second set of windings is arranged to operate as a second inductor and a third inductor. The first set of windings and the second set of windings are arranged to operate as a vertical coupling hybrid transformer.

According to one aspect, operating as the vertical coupling hybrid transformer includes transferring energy between the first set of windings and the second set of windings, where a majority of a total energy that is transferred between the first set of windings and the second set of windings occurs between windings on different layers of the die.

According to another aspect, operating as the vertical coupling hybrid transformer includes transferring energy between the first set of windings and the second set of windings, where a substantial amount of a total energy that is transferred between the first set of windings and the second set of windings occurs between windings on different layers of the die.

According to yet another aspect, the substrate is an insulative radio frequency (RF) substrate. In some implementations, the substrate is a glass substrate. The die may include a dielectric layer located between the first set of windings and the second set of windings. In some implementations, the dielectric layer is one of a low k dielectric and/or low-loss dielectric.

A second example provides a method for manufacturing a hybrid transformer in a semiconductor die. The method manufactures a first set of windings positioned on at least a first layer of the die. The first layer is positioned above a substrate of the die. The first set of windings includes a first port and a second port. The first set of windings is arranged to operate as a first inductor. The method manufactures a second set of windings positioned on at least a second layer of the die. The second layer is positioned above the substrate. The second set of windings includes a third port, a fourth port and a fifth port. The second set of windings is arranged to operate as a second inductor and a third inductor. The first set of windings and the second set of windings are arranged to operate as a vertical coupling hybrid transformer.

According to one aspect, operating as the vertical coupling hybrid transformer includes transferring energy between the first set of windings and the second set of windings, where a majority of a total energy that is transferred between the first set of windings and the second set of windings occurs between windings on different layers of the die.

According to another aspect, the substrate is an insulative radio frequency (RF) substrate. In some implementations, the substrate is a glass substrate. The die may include a dielectric layer located between the first set of windings and the second set of windings. In some implementations, the dielectric layer is one of a low k dielectric and/or low-loss dielectric.

A third example provides an apparatus for manufacturing a hybrid transformer in a die. The apparatus includes a means for manufacturing a first set of windings positioned on at least a first layer of the die. The first layer is positioned above a substrate of the die. The first set of windings includes a first port and a second port. The first set of windings is arranged to operate as a first inductor. The apparatus includes a means for manufacturing a second set of windings positioned on at least a second layer of the die. The second layer is positioned above the substrate. The second set of windings includes a third port, a fourth port and a fifth port. The second set of windings is arranged to operate as a second inductor and a third inductor. The first set of windings and the second set of windings are arranged to operate as a vertical coupling hybrid transformer.

According to one aspect, operating as the vertical coupling hybrid transformer includes transferring energy between the first set of windings and the second set of windings, where a majority of a total energy that is transferred between the first set of windings and the second set of windings occurs between windings on different layers of the die.

According to another aspect, the substrate is an insulative radio frequency (RF) substrate. In some implementations, the substrate is a glass substrate. The die may include a dielectric layer located between the first set of windings and the second set of windings. In some implementations, the dielectric layer is one of a low k dielectric and/or low-loss dielectric.

A fourth example provides a semiconductor die that includes a substrate and a hybrid transformer coupled to the substrate. The hybrid transformer includes a first inductor on at least a first layer of the die, a second inductor on at least a second layer of the die, a third inductor on at least the second layer of die. The first, second and third inductors are arranged to operate as a vertical coupling hybrid transformer.

According to one aspect, operating as the vertical coupling hybrid transformer includes transferring energy between the first set of windings and the second set of windings, where a majority of a total energy that is transferred between the first set of windings and the second set of windings occurs between windings on different layers of the die.

According to another aspect, the substrate is an insulative radio frequency (RF) substrate. In some implementations, the substrate is a glass substrate. The die may include a dielectric layer located between the first set of windings and the second set of windings. In some implementations, the dielectric layer is one of a low k dielectric and/or low-loss dielectric.

A fifth example provides a semiconductor die that includes a substrate and means for providing vertical energy coupling. The means for providing vertical energy coupling includes a first inductor on at least a first layer of the die: a second inductor on at least a second layer of the die; and a third inductor on at least the second layer of die. The first, second and third inductors are arranged to provide vertical energy coupling.

According to one aspect, operating as the vertical coupling hybrid transformer includes transferring energy between the first set of windings and the second set of windings, where a majority of a total energy that is transferred between the first set of windings and the second set of windings occurs between windings on different layers of the die.

According to another aspect, the substrate is an insulative radio frequency (RF) substrate. In some implementations, the substrate is a glass substrate. The die may include a dielectric layer located between the first set of windings and the second set of windings. In some implementations, the dielectric layer is one of a low k dielectric and/or low-loss dielectric.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Several novel features pertain to a hybrid transformer formed within a semiconductor die having multiple layers. The hybrid transformer includes a first set of windings and a second set of windings. The first set of windings is positioned on at least a first layer of the die. The first layer is positioned above a substrate of the die. The first set of windings includes a first port and a second port. The first set of windings is arranged to operate as a first inductor. The second set of windings is positioned on at least a second layer of the die. The second layer is positioned above the substrate. The second set of windings includes a third port, a fourth port and a fifth port. The second set of windings is arranged to operate as a second inductor and a third inductor. The first set of windings and the second set of windings are arranged to operate as a vertical coupling hybrid transformer.

Exemplary Vertical Coupling Transformer in a Die

Figure 1A:
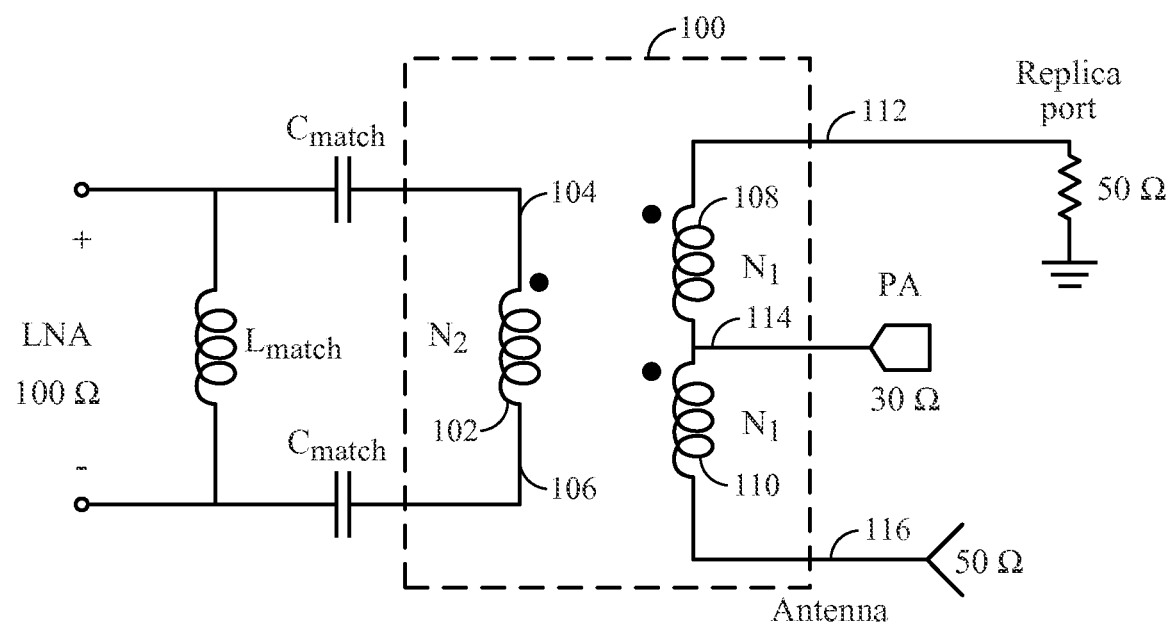
FIG. 1A illustrates a circuit diagram of a hybrid transformer.
Figure 1B:
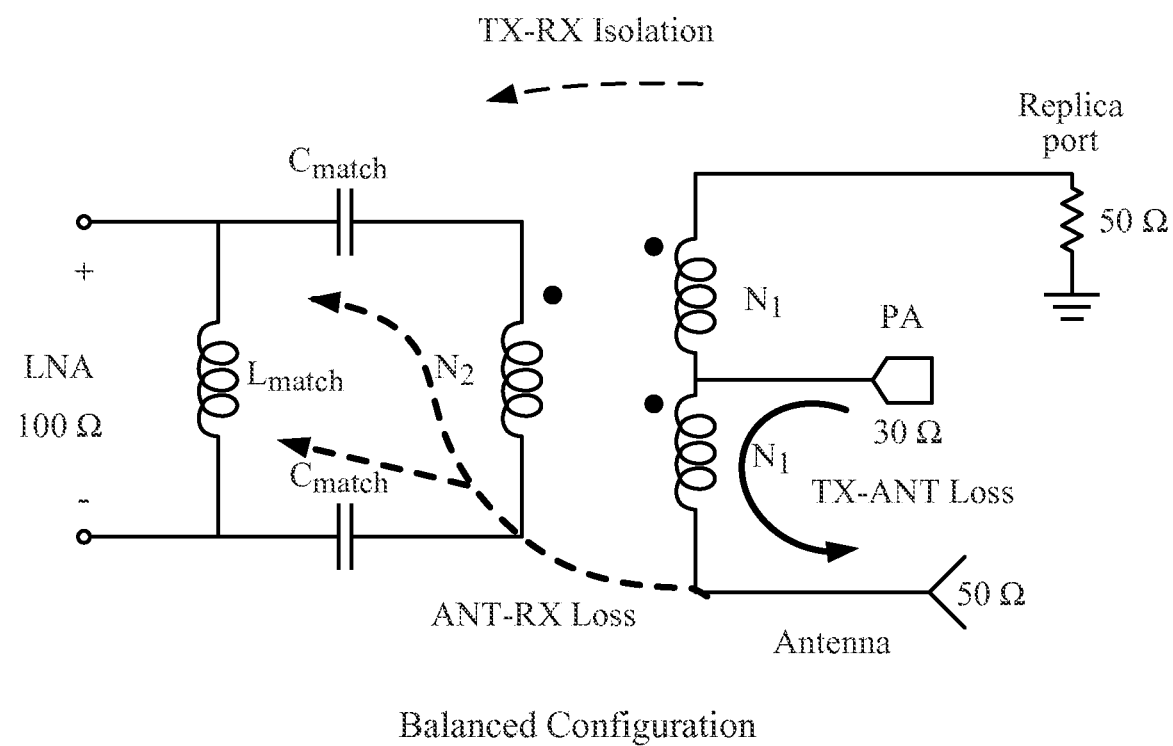
FIG. 1B illustrates a circuit diagram of a hybrid transformer with a balanced configuration.
Figure 1C:
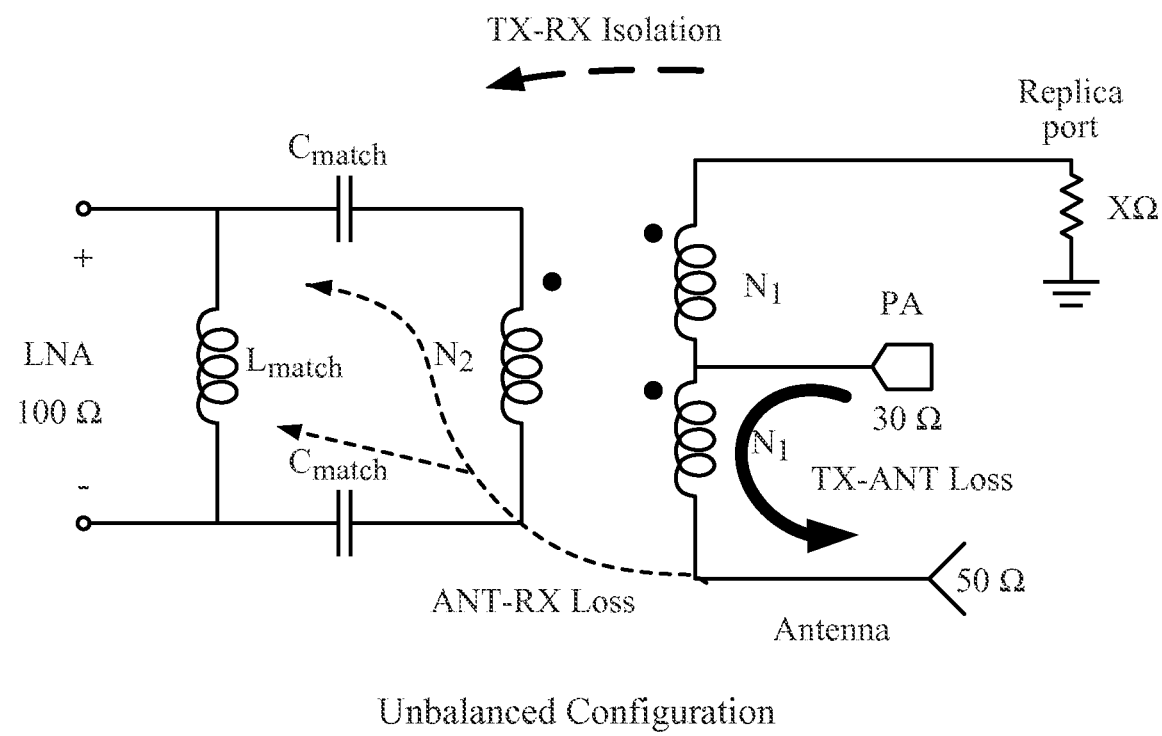
FIG. 1C illustrates a circuit diagram of a hybrid transformer with an unbalanced configuration.
Figure 2:
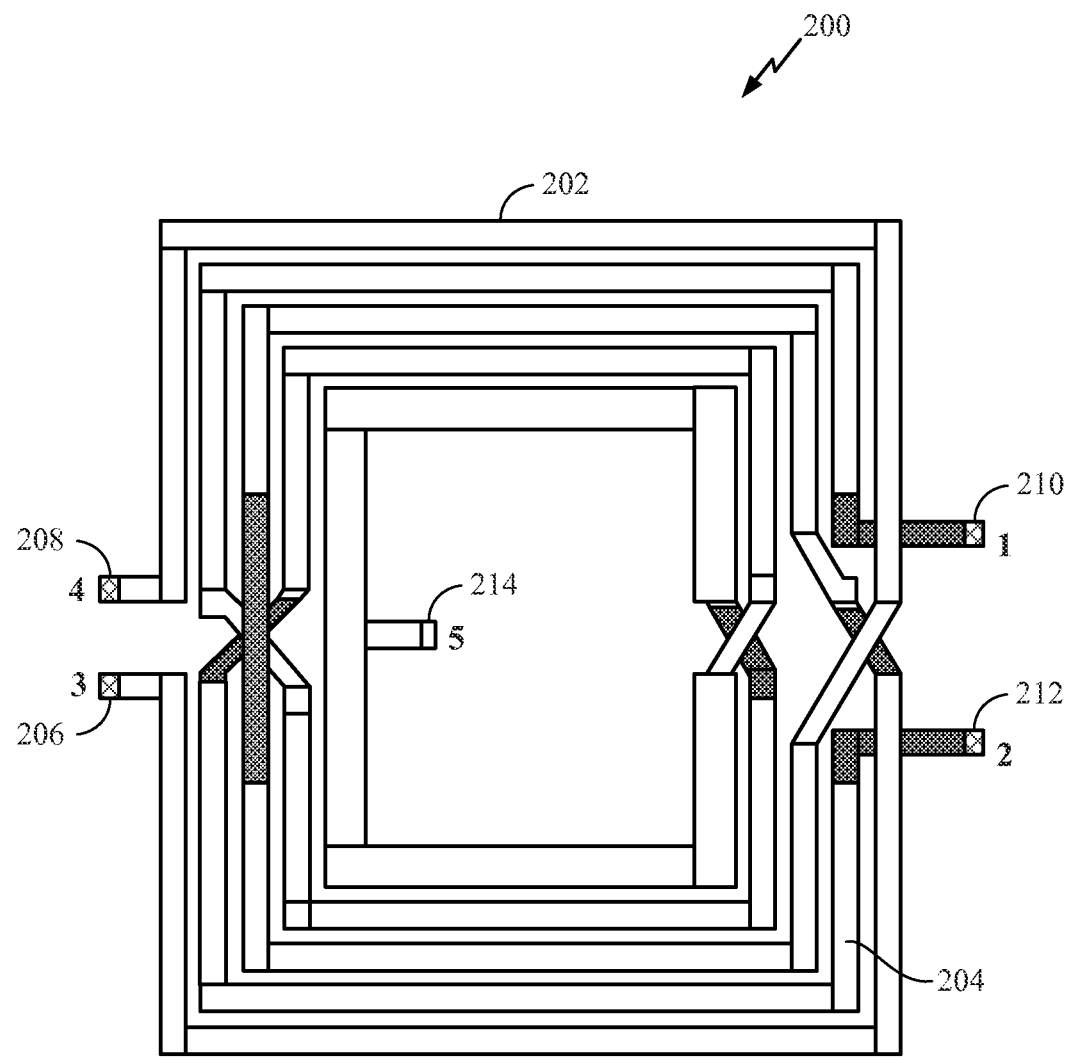
FIG. 2 illustrates a lateral coupling hybrid transformer.
Figure 3:
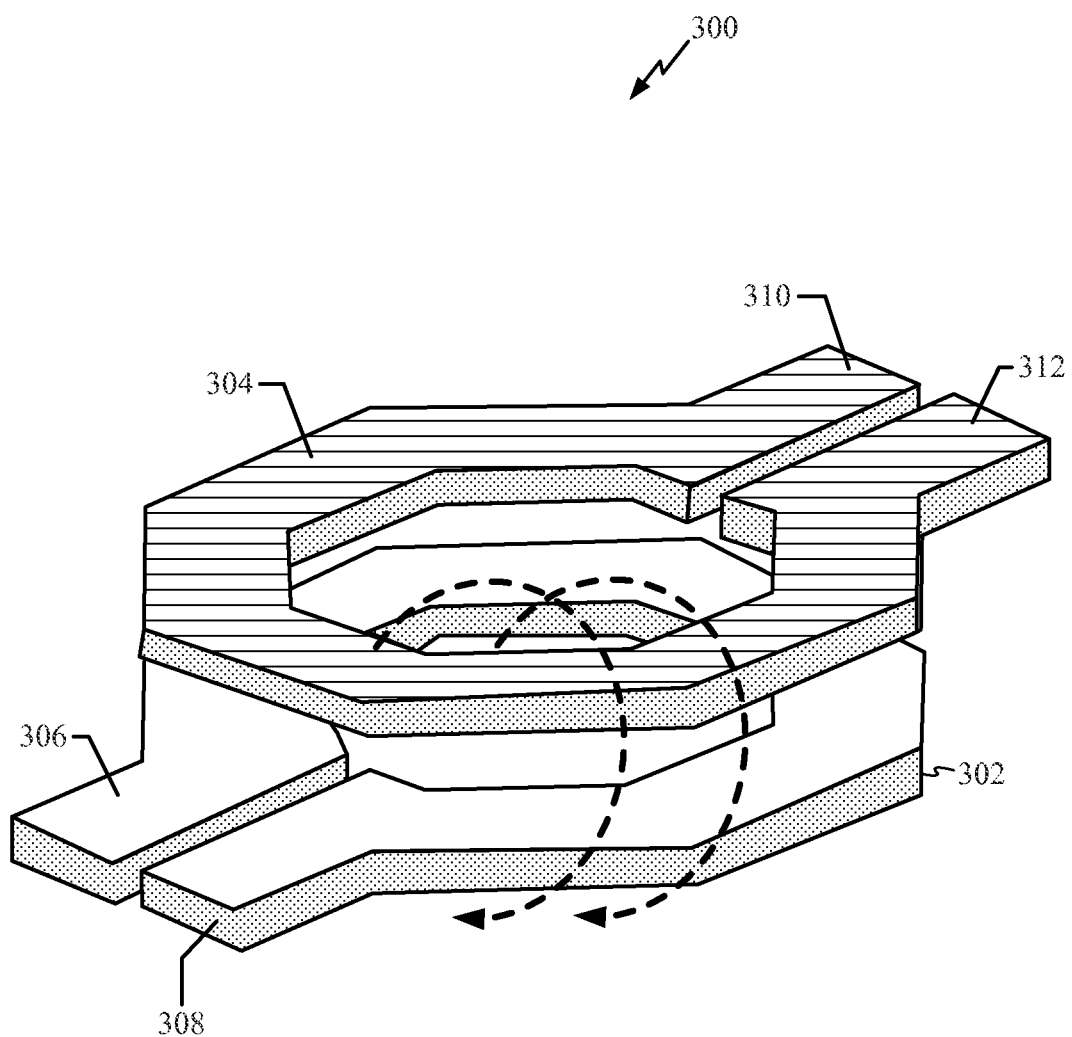
FIG. 3 illustrates a vertical coupling transformer.

FIG. 3 illustrates an example of a transformer 300 in a die in some implementations. As shown in FIG. 3, the transformer 300 includes a first winding 302 and a second winding 304. The first winding 302 includes a first port 306 and a second port 308. The first winding 302 may be part of a first circuit. The second winding 304 includes a third port 310 and a fourth port 312. The second winding 304 may be part of a second circuit. The second winding 304 is positioned above (vertically) the first winding 302. As further shown in FIG. 3, there is vertical energy coupling/vertical coupling between the first winding 302 and the second winding 304. That is, energy is transferred between windings that are on different layers of the die. More specifically, energy is being transferred from a first winding from a first circuit on one layer of a die to a second winding from a second circuit on another layer of the die.

A vertical coupling transformer may refer to a transformer that allows energy to be transferred from a first circuit to a second circuit, where a majority of the total energy that is transferred from the first circuit to the second circuit is transferred from windings on a first circuit on one layer to windings on a second circuit on another layer.

A vertical coupling transformer may also refer to a transformer that allows energy to be transferred from a first circuit to a second circuit, where a substantial/significant portion of the total energy that is transferred from the first circuit to the second circuit is transferred from windings on a first circuit on one layer to windings on a second circuit on another layer.

Vertical coupling provides several advantages over lateral coupling. First, a transformer structure that utilizes vertical coupling is more efficient at transferring energy than a transformer structure that utilizes lateral coupling. Second, vertical coupling transformers provide higher inductor Q factors than lateral coupling transformers. A Q factor is a quality factor/value that defines the efficiency of an inductor. The higher the Q factor the closer the inductor approaches the behavior of an ideal inductor, which is a lossless inductor. Third, a transformer structure that utilizes vertical coupling occupies a more compact area than a transformer structure that utilizes lateral coupling.

Figure 4:
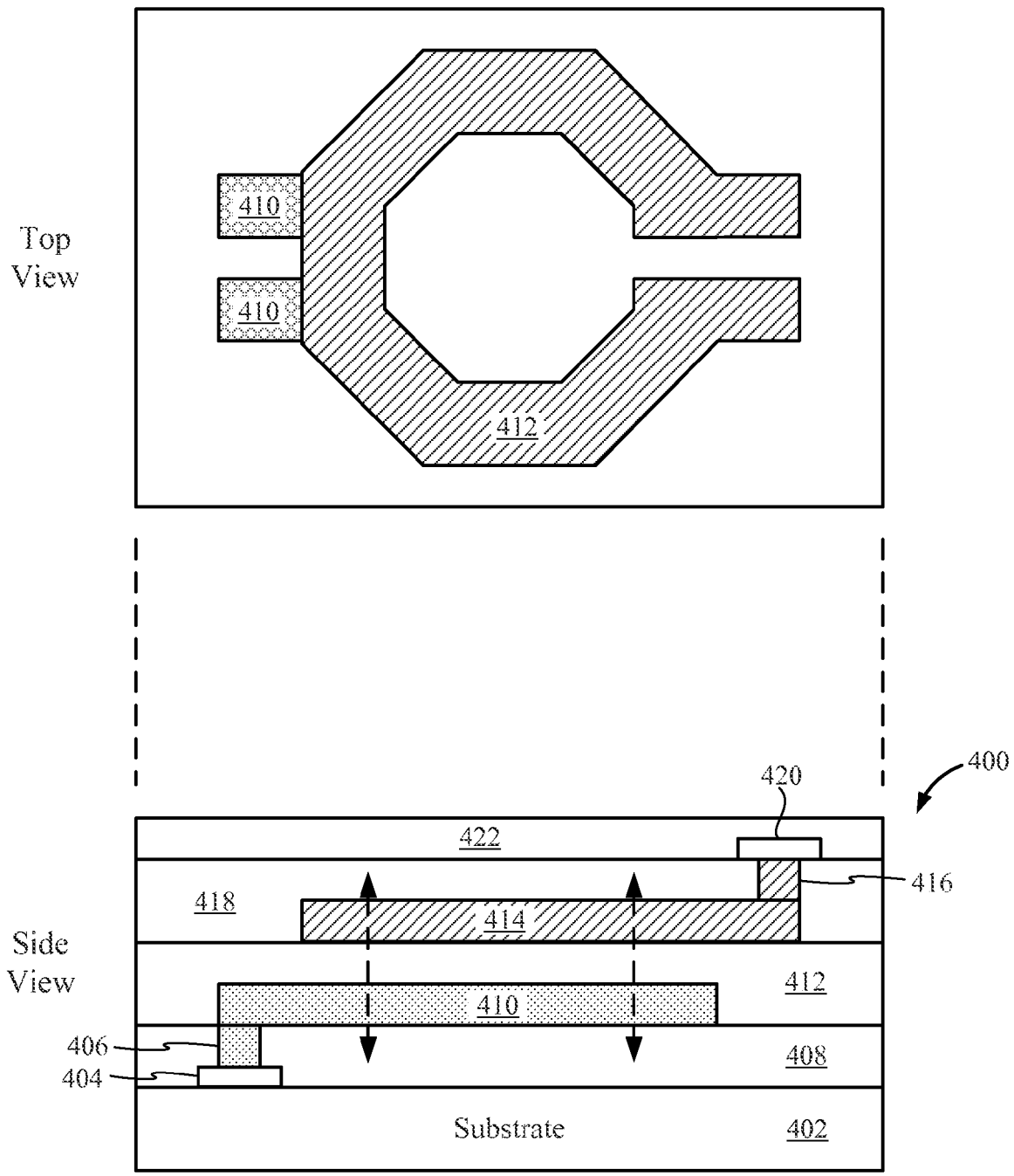
FIG. 4 illustrates a top view and side view of a vertical coupling transformer in a die.

FIG. 4 illustrates a top view and side view of a vertical coupling transformer in a die in some implementations. FIG. 4 may be a top view and side view of the vertical coupling transformer of FIG. 3. As shown in FIG. 4, a die 400 includes a substrate 402, a first metal layer 404, a via 406, a first dielectric layer 408, a second metal layer 410, a second dielectric layer 412, a third metal layer 414, a second via 416, a third dielectric layer 418, a fourth metal layer 420 and a passivation layer 422.

The second metal layer 410 defines the winding of a first circuit. The third metal layer 414 defines the winding of a second circuit. Each of the circuits has two ports. In this configuration, energy/power is being transferred from the second metal layer 410 to third metal layer 414, or vice versa (as represented by the dashed arrow). This energy transfer is vertical energy coupling because the second metal layer 410 is on a different layer of the die than the third metal layer 414.

Having described a vertical coupling transformer, several configurations of vertical coupling hybrid transformers will now be described below. First, it should be noted that the vertical coupling transformer of FIGS. 3 and 4 may be modified to become a vertical coupling hybrid transformer by adding a third port to either the first set of windings or the second set of windings. It should also be noted that the shapes used to represent the windings in the above and below FIGS are merely examples, and should be construed to mean the windings need to have those shapes. The windings of a hybrid transformer may have any shape and size.

Figure 5:
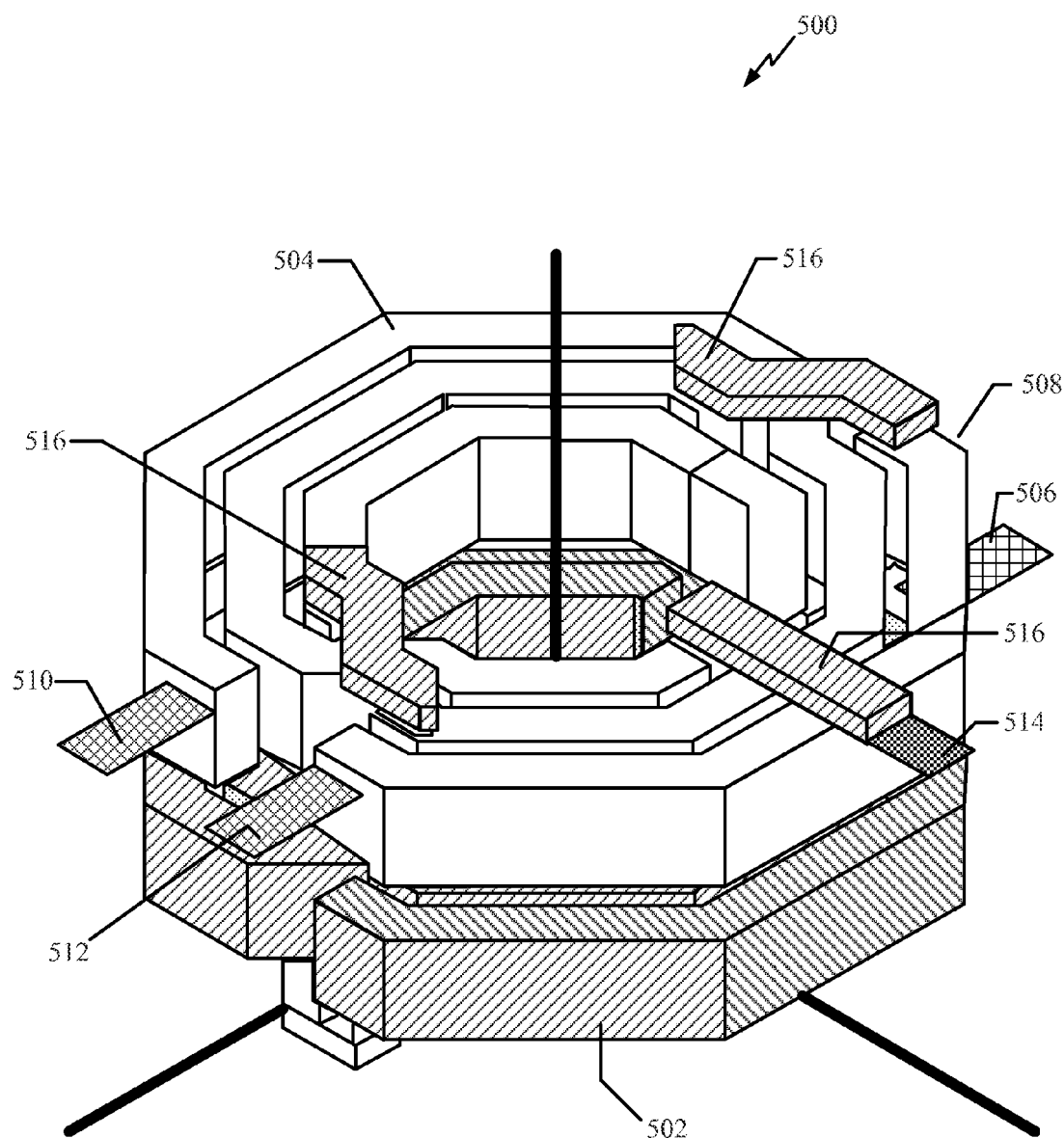
FIG. 5 illustrates a vertical coupling hybrid transformer with windings with multiple loops.

FIG. 5 illustrates an example of a vertical coupling hybrid transformer 500 in a die in some implementations. As shown in FIG. 5, the vertical coupling hybrid transformer 500 includes a first set of windings 502 and a second set of windings 504. The first set of windings includes a first port 506 and a second port 508. The second set of windings 504 includes a third port 510, a fourth port 512, and a fifth port 514. The second set of windings 504 also includes a set of interconnects 516. The first set of windings 502 is positioned above a substrate (not shown). The second set of windings 504 is positioned above the first set of windings 502. For the purpose of clarity, the dielectric layers are not shown.

FIG. 5 illustrates a vertical coupling hybrid transformer because energy is transferred between the first set of windings 502 and the second set of windings 504, which are on different layers of the die.

FIG. 5 further illustrates that the second set of windings 504 may be symmetrical to the first set of windings 502 in some implementations. FIG. 5 also illustrates that the second set of windings 504 includes the set of interconnects 516. The set of interconnects are positioned above the second set of windings 504. Although FIG. 5 illustrates that the second set of windings 504 is positioned above the first set of windings 502, in some implementations, the second set of windings 504 may be positioned below the first set of windings 502. That is, the second set of windings 504 may be positioned above the substrate (not shown) and the first set of windings 502 may be positioned above the second set of windings 504.

As further shown in FIG. 5, the first and second sets of windings 502-504 each has multiple loops or turns. That is, each set of windings loops multiple times on its respective layer. A loop or turn may be defined as a winding that has rotated by about 360 degrees (does not need to be exactly 360 degrees). A loop may also be defined over several layers of a die instead of just one layer of a die. Such loops will be further described below.

Figure 6:
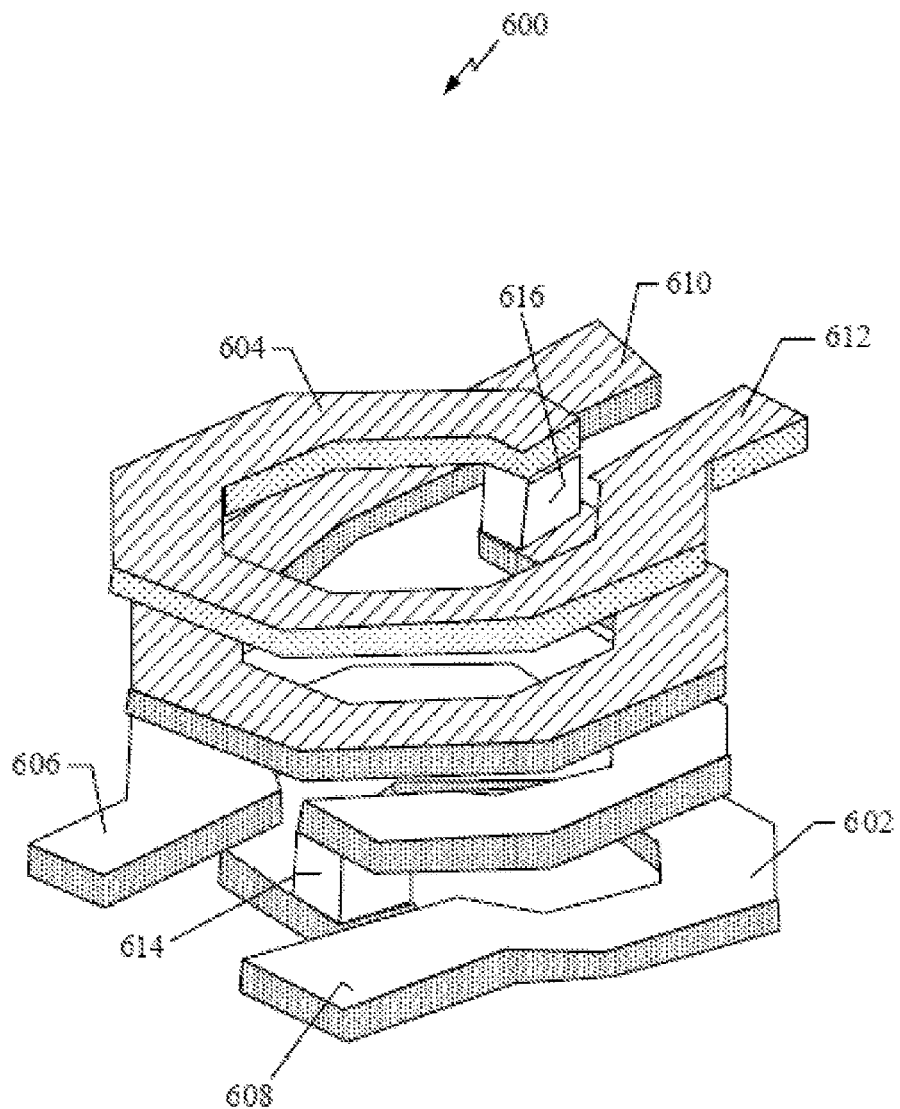
FIG. 6 illustrates a conceptual vertical coupling transformer with windings with multiple loops.

FIG. 6 illustrates an example of another vertical coupling hybrid transformer 600 in a die in some implementations. As shown in FIG. 6, the vertical coupling hybrid transformer 600 includes a first set of windings 602 and a second set of windings 604. The first set of windings 602 includes a first port 606 and a second port 608. The second set of windings 604 includes a third port 610 and a fourth port 612. Again for the purpose of clarity, the dielectric layers are not shown in FIG. 6.

The first set of windings 602 is positioned above a substrate (not shown) and is on a first layer and a second layer of die. The first port 606 is on the first layer and the second port is on the second layer. The first set of windings 602 includes a first via 614, which connects a first portion of the first set of windings 602 on the first layer with a second portion of the first set of windings 602 on the second layer.

The second set of windings 604 is positioned above the first set of windings 602 and is positioned on a third layer and a fourth layer of the die. The third port 610 is on the third layer and the fourth port 612 is on the fourth layer. The second set of windings 604 includes a second via 616, which connects the second set of windings 604 on the third layer with the second set of windings 604 on the fourth layer. As shown in FIG. 6, each of the first and second sets of windings 602-604 has 2 loops/turns. The loops/turns are facilitated by the vias described above. Different implementations may use different number of loops/turns. A loop may also be a partial loop. That is, a loop may also be a fraction and/or portion of a complete loop (e.g., 1.5 loops). In addition, each set of windings may use a different number of loops.

Figure 7:
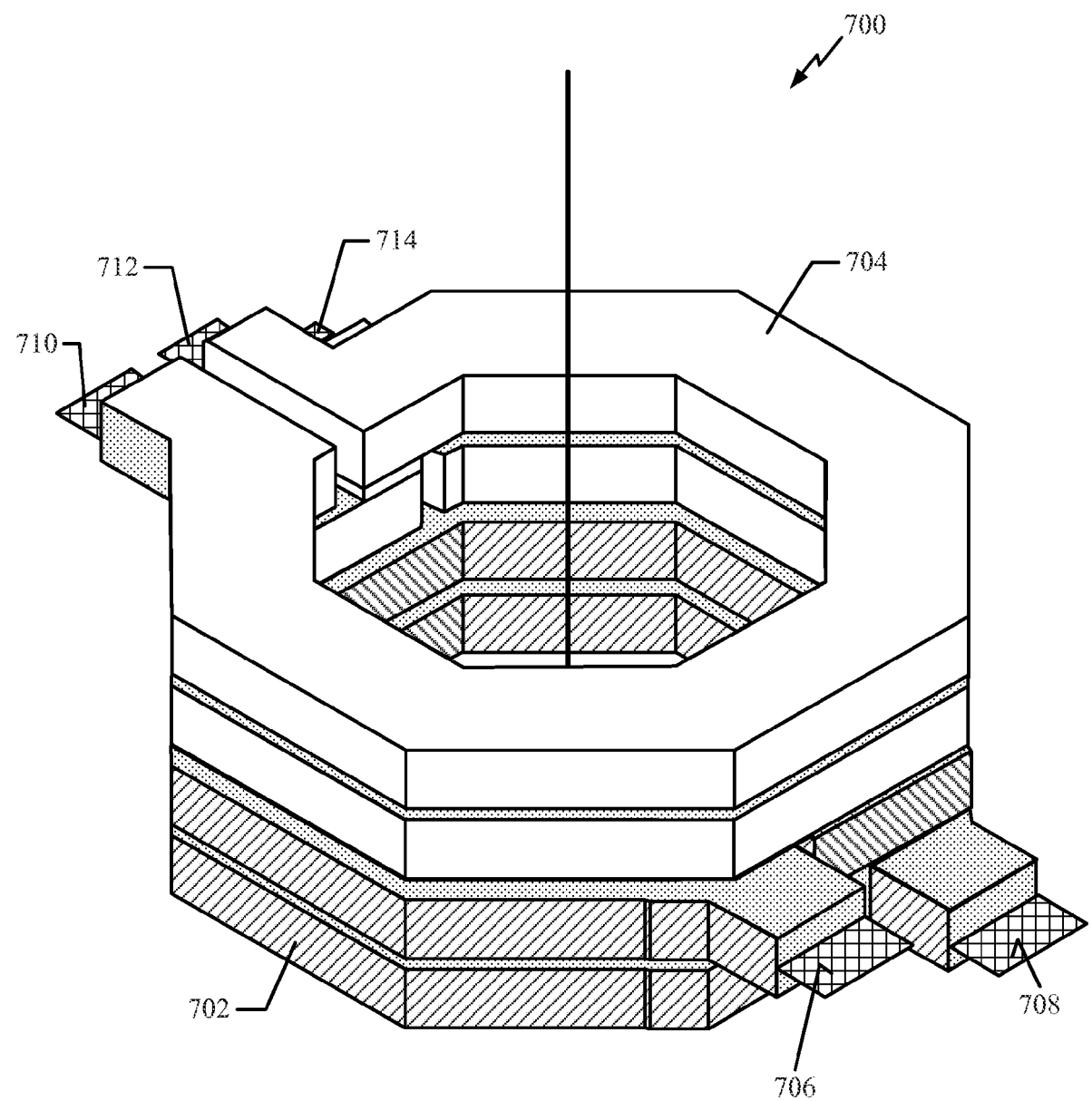
FIG. 7 illustrates a vertical coupling hybrid transformer with windings with multiple loops.

FIG. 7 illustrates an example of another vertical coupling hybrid transformer 700 in a die in some implementations. As shown in FIG. 7, the vertical coupling hybrid transformer 700 includes first set of windings 702 and a second set of windings 704. The first set of windings 702 includes a first port 706 and a second port 708. The second set of windings 704 includes a third port 710, a fourth port 712, and fifth port 714.

The first set of windings 702 is positioned above a substrate (not shown) and may be on a first layer and a second layer of the die (e.g., first and second metal layers of the die). The second set of windings 704 is positioned above the first set of windings 702 and may be positioned on the third layer and fourth layer of the die (e.g., third and fourth metal layers of the die). As shown in FIG. 7 each of the first and second sets of windings 702-704 has 2 loops/turns.

Although. FIG. 7 illustrates the second set of windings 704 is positioned above the first set of windings 702, in some implementations, the second set of windings 704 is positioned below the first set of windings 702. That is, the second set of windings 704 is positioned above the substrate (not shown) and the first set of windings 702 is positioned above the second set of windings 704.

Figure 8:
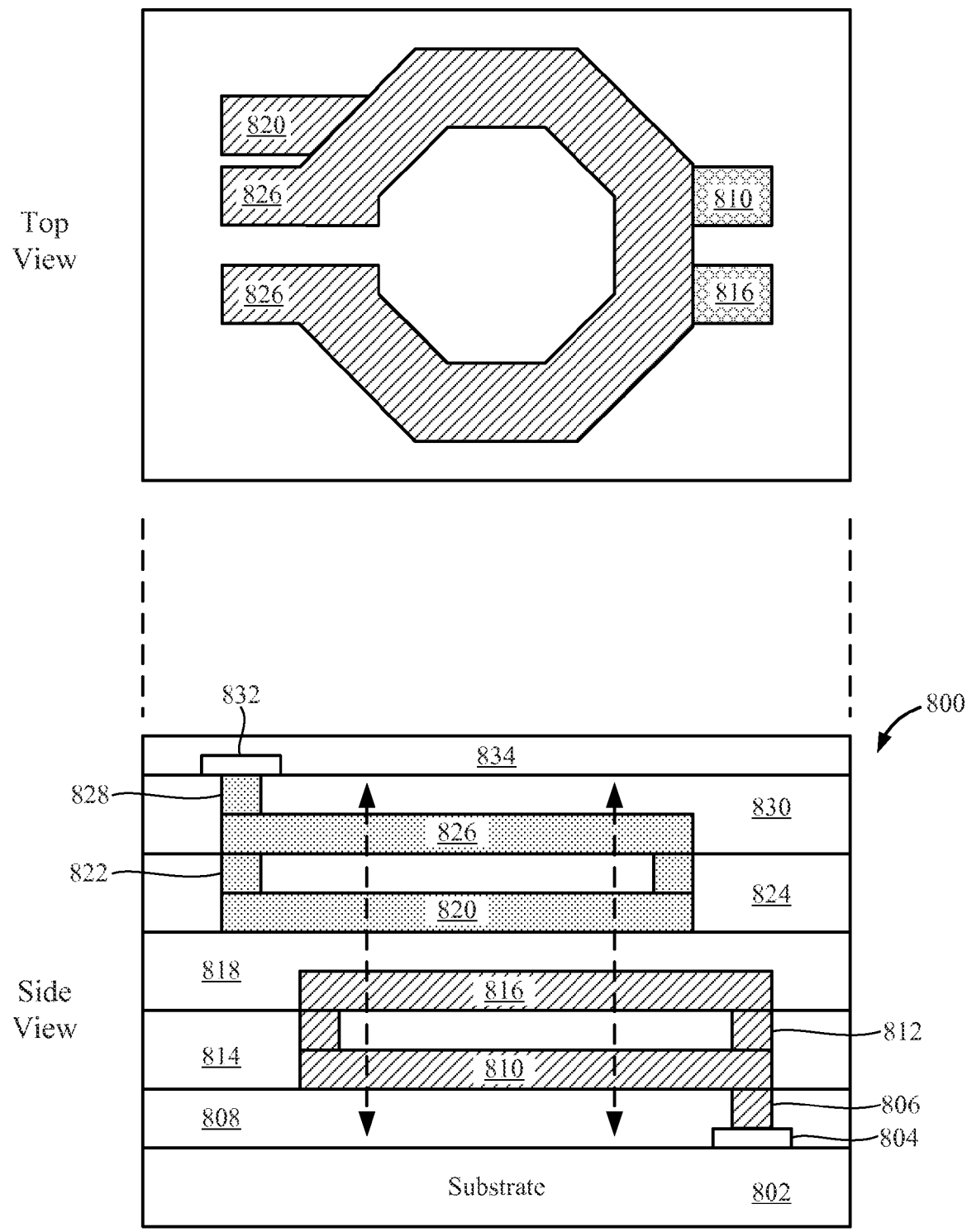
FIG. 8 illustrates a top view and side view of a vertical coupling hybrid transformer with windings multiple loops in a die.

FIG. 8 illustrates a top view and side view of a vertical coupling hybrid transformer in a die in some implementations. FIG. 8 may be a top view and side view of the vertical coupling hybrid transformer of FIG. 7. As shown in FIG. 8, a die 800 includes a substrate 802, a first metal layer 804, first vias 806, a first dielectric layer 808, a second metal layer 810, second vias 812, a second dielectric layer 814, a third metal layer 816, a third dielectric layer 818, a fourth metal layer 820, third vias 822, a fourth dielectric layer 824, a fifth metal layer 826, fourth vias 828, a fifth dielectric layer 830, a sixth metal layer 832 and a passivation layer 834.

The second metal layer 810 and the third metal layer 816 define the windings of a first circuit. As shown in the top view, the first circuit, which is defined by the second metal layer 810 and the third metal layer 816, has two ports. The fourth metal layer 820 and the fifth metal layer 826 define the windings of a second circuit. The second circuit, which is defined by the fourth metal layer 820 and the fifth metal layer 826, has three ports, as shown in the top view of FIG. 8.

The dielectric layers may be used to isolate the windings from different circuits of the vertical coupling hybrid transformer. The dielectric layers may have a low-k property. A low-k property material is typically an insulating material that has weak polarization when it is subjected to an applied electric field. The dielectric layer may also have a low-loss property. A dielectric with a low-loss property helps prevents TX-RX leakage.

Examples of a dielectric material with a low-k property and/or low-loss property include polyimide, acrylic, polybenzoxazole (PBO) and/or benzocyclobutene (BCB). Different implementations may use different materials for the dielectric layers. In some implementations, the same material is used for all the dielectric layers. In other implementations, at least two different dielectric layers have different dielectric materials. For example, in some embodiments, the dielectric layer 818 may be BCB while another dielectric layer may be acrylic.

The configuration of the vertical coupling hybrid transformer illustrated in FIG. 8, shows vertical energy transfer/coupling (which is indicated by the vertical arrows) between the first and second circuits. This is because the circuits are on different layers of the die.

A method for manufacturing a die that includes a vertical coupling hybrid transformer will be described below. However, before describing the manufacturing process of a hybrid transformer, another vertical coupling transformer will be described.

Figure 9:
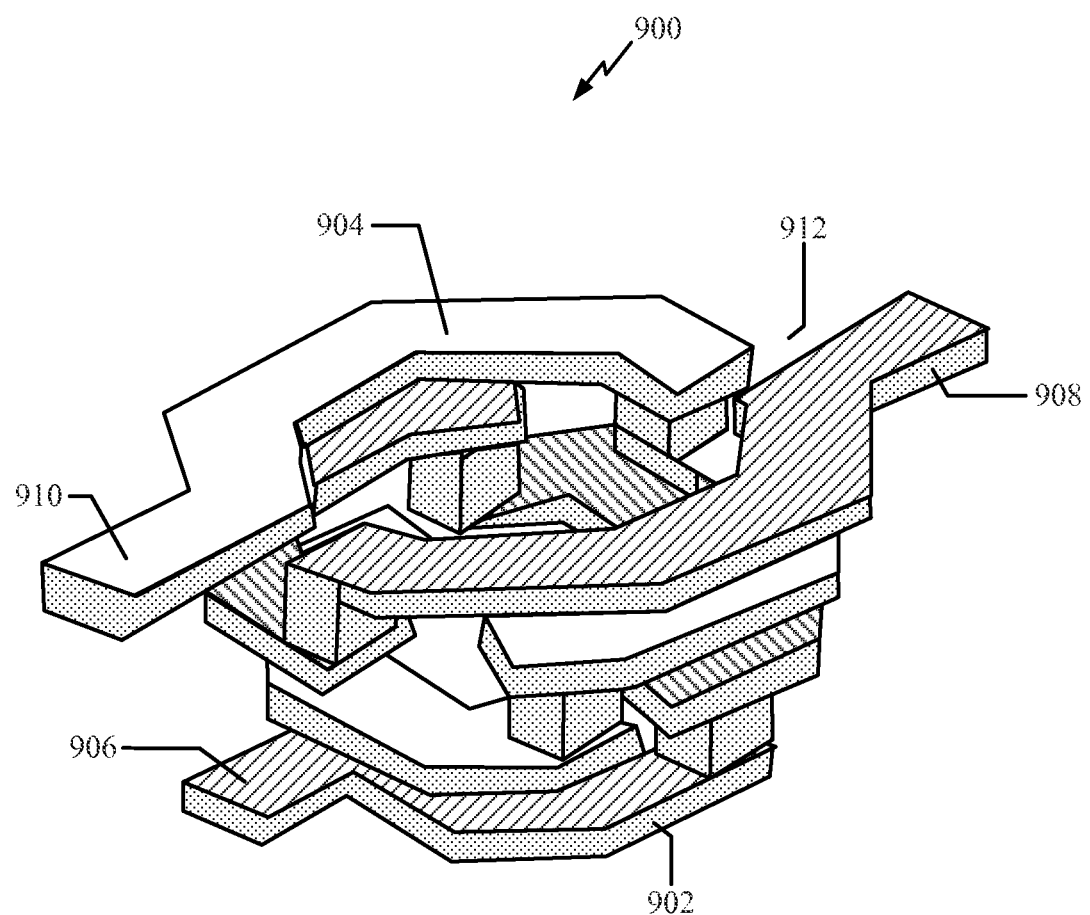
FIG. 9 illustrates a conceptual vertical coupling transformer with windings that are interleaved.

FIG. 9 illustrates an example of another vertical coupling transformer 900 in a die in some implementations. Specifically, FIG. 9 illustrates a vertical coupling transformer that includes two sets of windings that are interleaved to each other. As shown in FIG. 9, the vertical coupling transformer 900 includes a first set of windings 902 and a second set of windings 904. The first set of windings 902 includes a first port 906 and a second port 908. The second set of windings 904 includes a third port 910 and a fourth port 912.

As mentioned above, the first set of windings 902 is interleaved with the second set of windings 904. That is, portions of the first set of windings 902 are located on the same layer as portions of the second set of windings 904. As shown in FIG. 9, a first portion of the first set of windings 902 and a first portion of the second set of windings 904 are located on the first layer of a die. Similarly, a second portion of the first set of windings 902 and a second portion of the second set of windings 904 are located on the second layer of the die. A third portion of the first set of windings 902 and a third portion of the second set of windings 904 are located on the third layer of the die. Finally, a fourth portion of the first set of windings 902 and a fourth portion of the second set of windings 904 are located on the fourth layer of the die.

For each respective set of windings, vias are used to connect portions of the respective set of windings. The first and fourth ports 906 and 912 are located on the first layer of the die. The second and third ports 908-910 are located on the fourth layer of the die. Although, the ports may located in other layers of the die.

Even though portions of windings from different circuits are on the same layer, FIG. 9 illustrates vertical coupling because energy is being transferred between portions of windings that are on different layers of the die.

Having described a vertical coupling transformer with interleaved windings, a vertical coupling hybrid transformer will now be described below.

Figure 10:
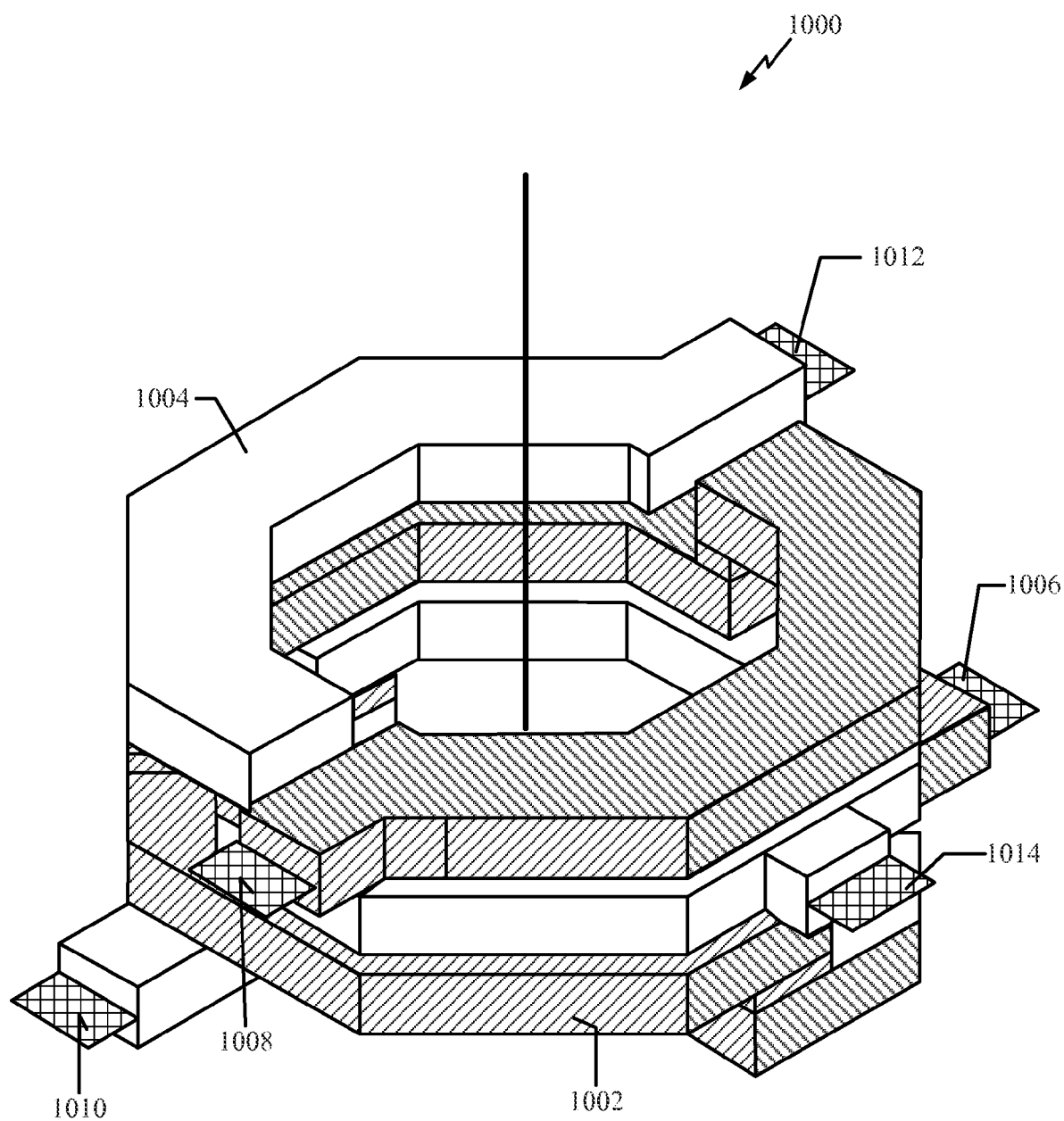
FIG. 10 illustrates a vertical coupling hybrid transformer with windings that are interleaved.

FIG. 10 illustrates an example of another vertical coupling hybrid transformer 1000 in a die in some implementations. Specifically, FIG. 10 illustrates a vertical coupling hybrid transformer that includes two sets of windings that are interleaved to each other. As shown in FIG. 10, the vertical coupling hybrid transformer 1000 includes a first set of windings 1002 and a second set of windings 1004. The first set of windings 1002 includes a first port 1006 and a second port 1008. The second set of windings 1004 includes a third port 1010, a fourth port 1012, and fifth port 1014.

As described above, the first set of windings 1002 is interleaved with the second set of windings 1004. That is, portions of the first set of windings 1002 are located on the same layer as portions of the second set of windings 1004. As shown in FIG. 10, a first portion of the first set of windings 1002 and a first portion of the second set of windings 1004 are located on the first layer. Similarly, a second portion of the first set of windings 1002 and a second portion of the second set of windings 1004 are located on the second layer. A third portion of the first set of windings 1002 and a third portion of the second set of windings 1004 are located on the third layer. Finally, a fourth portion of the first set of windings 1002 and a fourth portion of the second set of windings 1004 are located on the fourth layer. The first and fourth ports 1006 and 1010 are located on the first layer. The second and third ports 1008 and 1012 are located on the fourth layer. The fifth port 1014 is located on the third layer. In some implementations, the layers are metal layers of the die. The metal layers may be traces or wires on the die.

In this configuration of a vertical coupling hybrid transformer, vertical energy coupling occurs, as energy is being transferred between windings on different layers. For example, in some implementations, there is vertical energy coupling between the fourth portion of the first set of windings 1002 (which is on the fourth layer die) and the third portion of the second set of windings 1004 (which is on the third layer of the die).

The above described configurations of the various vertical coupling hybrid transformers have better performance and properties than lateral coupling hybrid transformers. For example, the configurations described above provide enhanced TX-RX isolation, reduced ANT-RX insertion loss, and reduced TX-ANT insertion loss. In some implementations, this is due to the enhanced Q factor and k material used in the vertical coupling hybrid transformer. Moreover, the vertical coupling hybrid transformer described above is more compact than lateral coupling hybrid transformers. Also, vertical coupling hybrid transformers are more cost effective than lateral coupling hybrid transformers due to their compact size.

In some embodiments, the increased performance of the described vertical coupling hybrid transformers allow them to be used as effective signal duplexers, replacing Surface Acoustic Wave (SAW) and Film Bulk Acoustic Resonator (FBAR) duplexer technology.

Having described various vertical coupling hybrid transformers in a die, a process for manufacturing vertical coupling hybrid transformers in a die will now be described.

Exemplary Manufacturing of a Die with a Vertical Hybrid Transformer

Figure 11:
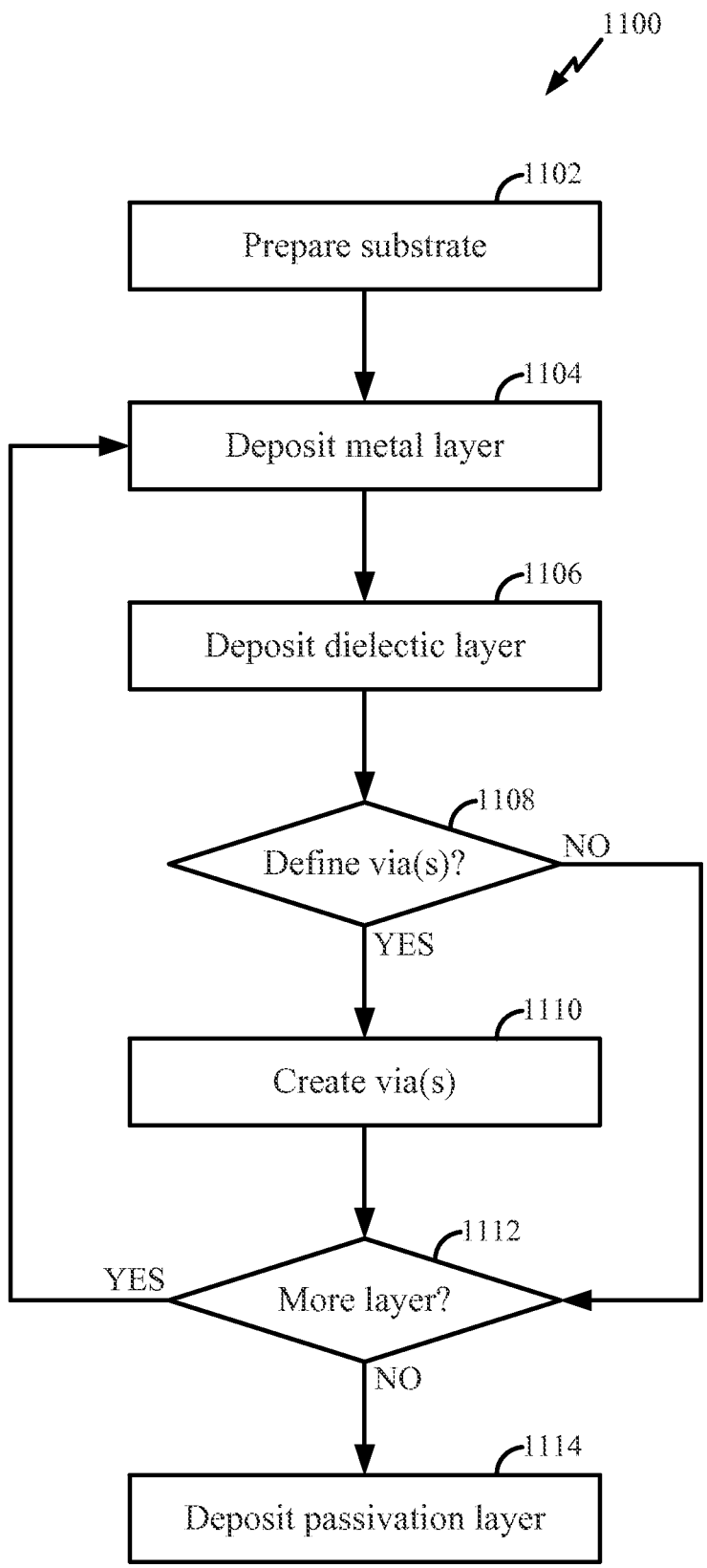
FIG. 11 illustrates a flow diagram of a method for manufacturing a die that includes a vertical coupling hybrid transformer.

As described above, the vertical coupling hybrid transformer can be manufactured in a die. FIG. 11 illustrates a general detailed method 1100 for manufacturing a die that includes a hybrid transformer. The method 1100 is a generalization of how a die is manufactured and is not intended to capture every single steps of manufacturing a die. The method of FIG. 11 may be used to manufacture a die that includes a vertical coupling hybrid transformer. In some implementations, the method of FIG. 11 is referred to as complementary metal oxide semiconductor (CMOS) back-end of line (BEOL) process technology.

The method begins by (at 1102) preparing a substrate. This may include cleaning the substrate in order for a metal layer to be deposited on the substrate. The substrate can be any material, including a glass substrate. Next, the method deposits (at 1104) a metal layer on top of the substrate. The metal layer may define one or more windings of a vertical coupling hybrid transformer. Depositing the metal layer may include other manufacturing processes, such as etching portions of the metal layer to define the windings. The windings may be represented as wires and/or traces.

After depositing (at 1104) the metal layer, the method deposits (at (1106) a dielectric layer. Different embodiments may deposit the dielectric layer differently. The dielectric layer may be used to isolate the windings defined by the metal layers. The dielectric layers may also be used to isolate the windings from different circuits of the vertical coupling hybrid transformer. The dielectric layer may have a low-k property. A low-k property material is typically an insulating material that has weak polarization when it is subjected to an applied electric field. The dielectric layer may also have a low-loss property. Examples of a dielectric material with a low-k property and/or low-loss property include polyimide, acrylic, polybenzoxazole (PBO) and/or benzocyclobutene (BCB).

Next, the method determines (at 1108) whether to define vias. If so, the method creates (at 1110) one or more vias. Creating a via may include creating an opening in the dielectric layer (by etching for example) to expose the metal layer that was previously deposited and depositing metal in the opening to create the via. Multiple vias may be created in the layer.

After creating the vias (at 1110) or determining (at 1108) that no vias need to be defined, the method determines (at 1112) whether there is at least one metal layer to add to the die. If so, the method proceeds to 1104 to deposit another metal layer on top of the previous dielectric layer. The method may iterate several times the steps of depositing (at 1104) the metal layer, depositing (at 1106) the dielectric layer, and the defining (at 1110) of the vias. Depositing (at 1104) the metal layer may also include defining interconnects for the windings in some implementations. During each iteration, the method may define different thicknesses for each layer (e.g., metal and/or dielectric). For example, some metal layers may be thinner than other metal layers. In addition, the method may also use different dielectric materials for at least one of the dielectric layers. The reason for using different dielectric materials as well as the different thicknesses of the layers (e.g., metal and/or dielectric layers) will be further described below.

Once the method determines (at 1112) that no additional metal layers need to be defined, the method deposits (at 1114) a passivation layer and end. The passivation layer is a protective layer that protects the metal layers from oxidation. The passivation layer may be made of a dielectric material in some implementations.

Although not shown in FIG. 11, some implementations of the method may further create an opening in the passivation layer and fill the opening with metal to form a via and/or pad. The via and/or pad may be use to electrically connect the die to other external components. For example, the via and/or pad may be used to connect to probes. In some implementations, an under bump structure may be defined to connect the die to external components, such as a probe.

Typically, multiple dies are manufactured at the same time on a wafer. In which case, the wafer is then cut into separate dies. However, for the purpose of clarity, the method of FIG. 11 is described as if only one die is being manufactured. Moreover, other elements of a die may also be manufactured, which has not been described above (e.g., under bump metallization (UBM)).

Having described a flow diagram of a method for manufacturing a die, a layer by layer process for manufacturing a die that includes a vertical coupling hybrid transformer will now be described.

Figure 12:
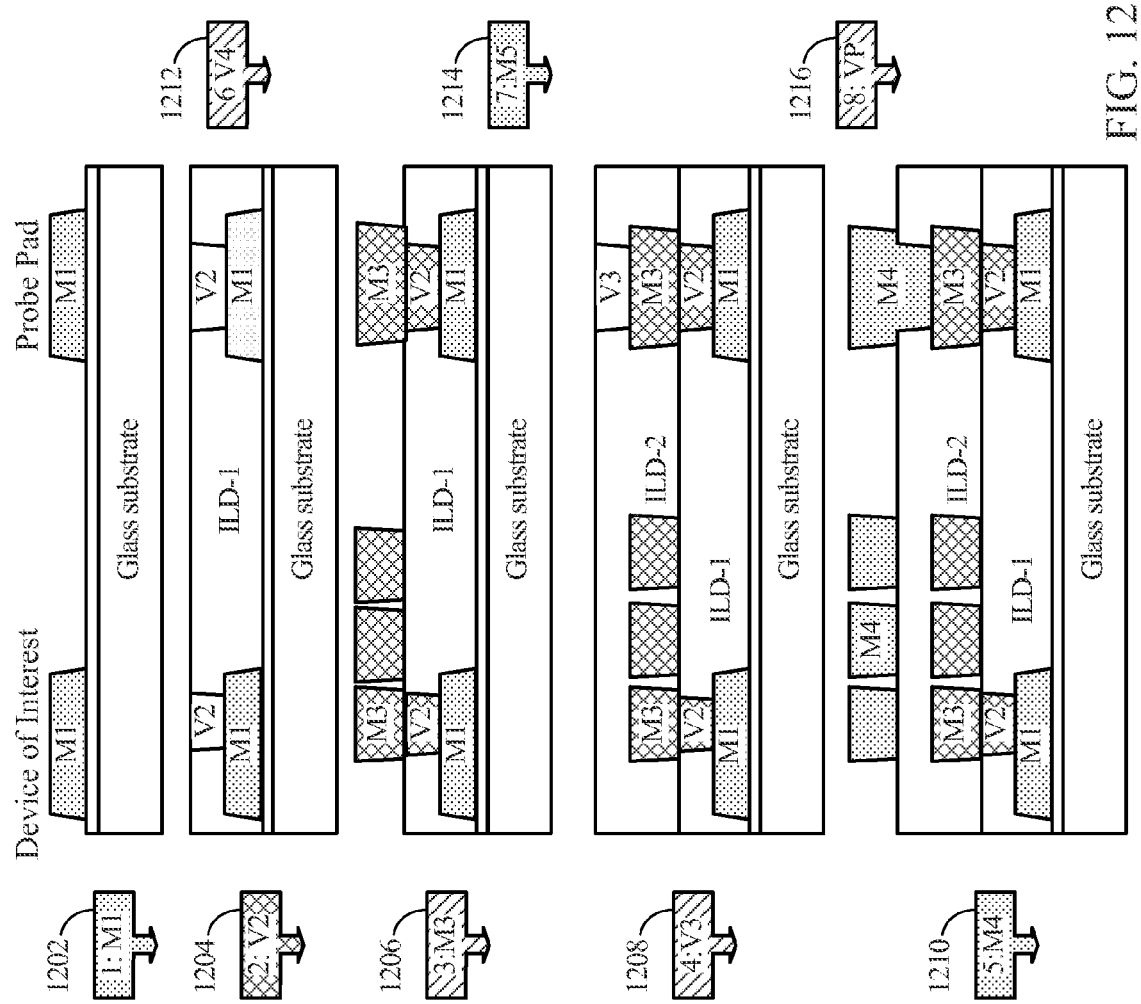
FIG. 12 illustrates the different layers of a manufacturing process of a die that includes a vertical coupling hybrid transformer.

FIG. 12 illustrates an example of a layer by layer process for manufacturing a hybrid coupling transformer in some implementations. As shown in this FIG. 12, the process 1200 deposits (at 1202) a first metal layer on top of a substrate. In this example, the substrate is a glass substrate. However, the substrate can be other materials as well. As shown in FIG. 12, the first metal layer includes a component for the hybrid transformer and a component for a probe pad. The process 1200 then deposits (at 1204) a first dielectric layer and then defines (at 1204) a set of vias in the dielectric layer on top of the first metal layer. In some implementations, the first dielectric is a low k and/or low-loss dielectric. As previously discussed, examples of a low k dielectric include polyimide, acrylic, polybenzoxazole (PBO) and benzocyclobutene (BCB), etc.

Next, the process 1200 deposits (at 1206) a second metal layer. The second metal layer includes a first set of windings in some implementations. The process 1200 then deposits (at 1208) a second dielectric layer and defines (at 1208) a second set of vias in the second dielectric layer and on top of the second metal layer. After depositing the second dielectric and defining the second set of vias, the process 1200 then deposits (at 1210) a third metal layer. The third metal layer can include the first set of windings in some implementations. After depositing (at 1210) the third metal layer, the process 1200 deposits (at 1212) a third dielectric layer and defines (at 1212) a third set of vias. Once the third dielectric is deposited and the third set of vias is defined, the process 1200 deposits (at 1214) a fourth metal layer. The fourth metal layer may include a second set of windings in some implementations. The process 1200 then deposits (at 1216) a passivation layer (PSV) and defines via pads (VP), and then ends.

Figure 13:
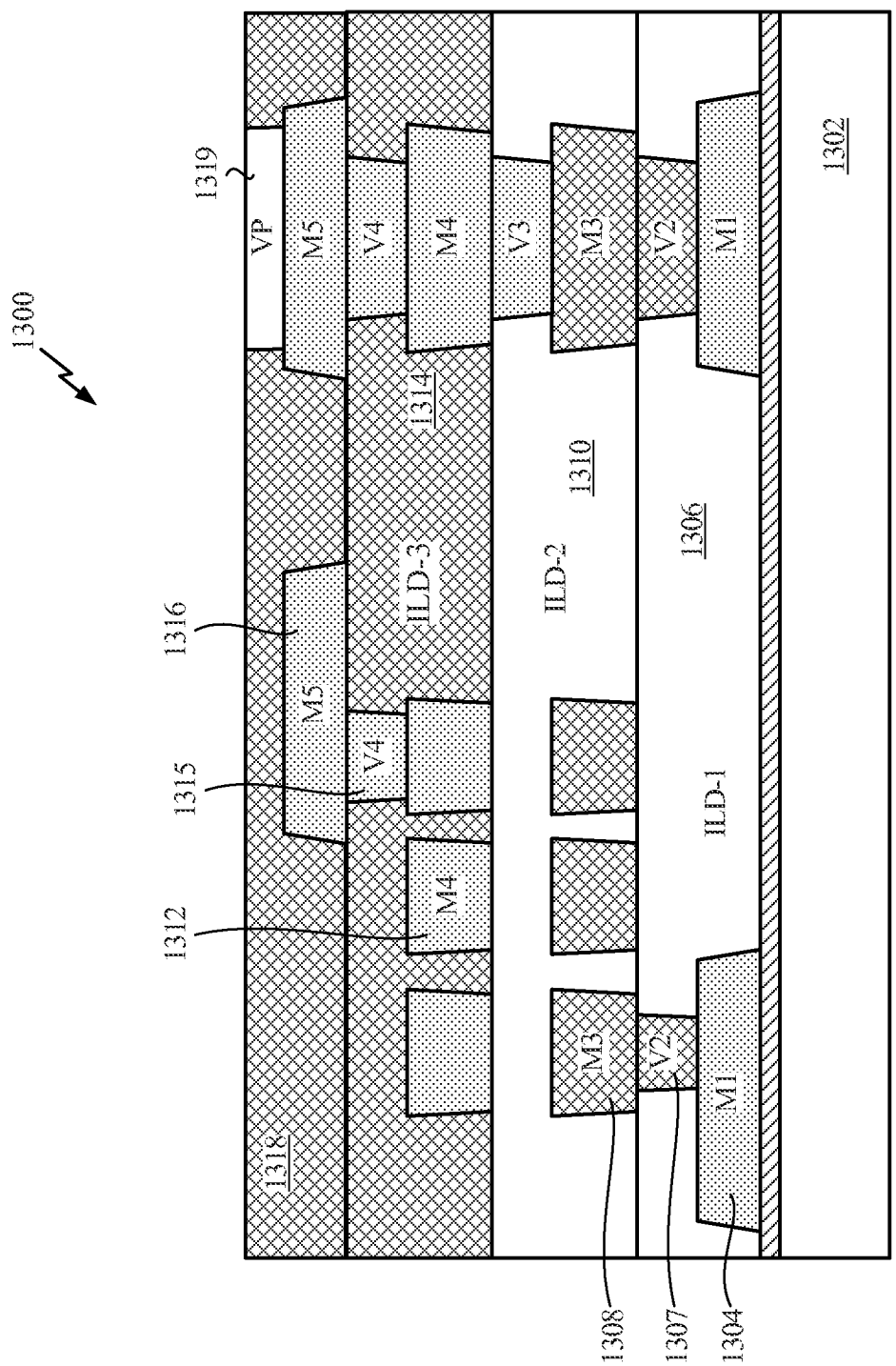
FIG. 13 illustrates a die that includes a vertical coupling hybrid transformer.

FIG. 13 illustrates a conceptual illustration of a die that includes a vertical coupling hybrid transformer after the process of FIG. 12. As shown in FIG. 13, the die 1300 includes a substrate 1302, a first metal layer 1304, a first dielectric layer 1306, a second metal layer 1308, a second dielectric layer 1310, a third metal layer 1312, a third dielectric layer 1314, a fourth metal layer 1316, and a passivation layer 1318. The die 1300 may include additional dielectric layers, such as one directly above the substrate 1302.

The first metal layer 1304 is positioned above the substrate 1302 and may define a winding of a vertical hybrid transformer. The first metal layer 1304 may also define a conductive layer of a probe pad. In some implementations, the first metal layer 1304 may have a thickness between 1-3 microns (um).

The first dielectric layer 1306 is positioned above the first metal layer 1304. The first dielectric layer may include several vias that are coupled to the first metal layer 1304. The first dielectric layer 1306 may have a first dielectric property. In some implementations, the first dielectric layer 1306 may have a thickness between 3-5 microns (um). The vias 1307 in the first dielectric layer 1306 may have a thickness of approximately 2 microns.

The second metal layer 1308 is positioned above the first dielectric layer 1306 and may also define a winding of the vertical coupling hybrid transformer. The second metal layer 1308 may also define another conductive layer of a probe pad. In some implementations, the second metal layer 1308 may have a thickness of about 10 microns.

The second dielectric layer 1310 is positioned above the first metal layer 1304. The second dielectric layer 1310 may include several vias that are coupled to the second metal layer 1308. The second dielectric layer 1310 may have a second dielectric property that is different than the first dielectric property. In some implementations, the second dielectric layer 1310 may have a thickness of about 15 microns. The vias in the second dielectric layer 1310 may have a thickness of approximately 5 microns.

The third metal layer 1312 is positioned above the second dielectric layer 1310 and may also define another winding of the vertical coupling hybrid transformer. The third metal layer 1312 may also define another conductive layer of a probe pad. The third dielectric layer 1314 is positioned above the third metal layer 1312. The third dielectric layer 1314 may include several vias (e.g., via 1315) that are coupled to the third metal layer 1312. The third dielectric layer 1314 may have a third dielectric property that is different than the first and second dielectric properties.

The fourth metal layer 1316 is positioned above the third dielectric layer 1314 and may also define another winding of the vertical coupling hybrid transformer. The fourth metal layer 1316 may also define another conductive layer of a probe pad. The passivation layer 1318 is positioned above the fourth metal layer 1316. The passivation layer 1318 may include several vias (e.g., VP 1319) that are coupled to the fourth metal layer 1316.

Different dielectric materials for the dielectric layers may be used. In addition, different thicknesses may be used for the different layers of the die. As such, the thicknesses described above are merely examples and should not be construed as limiting the layers to those dimensions.

Figure 14:
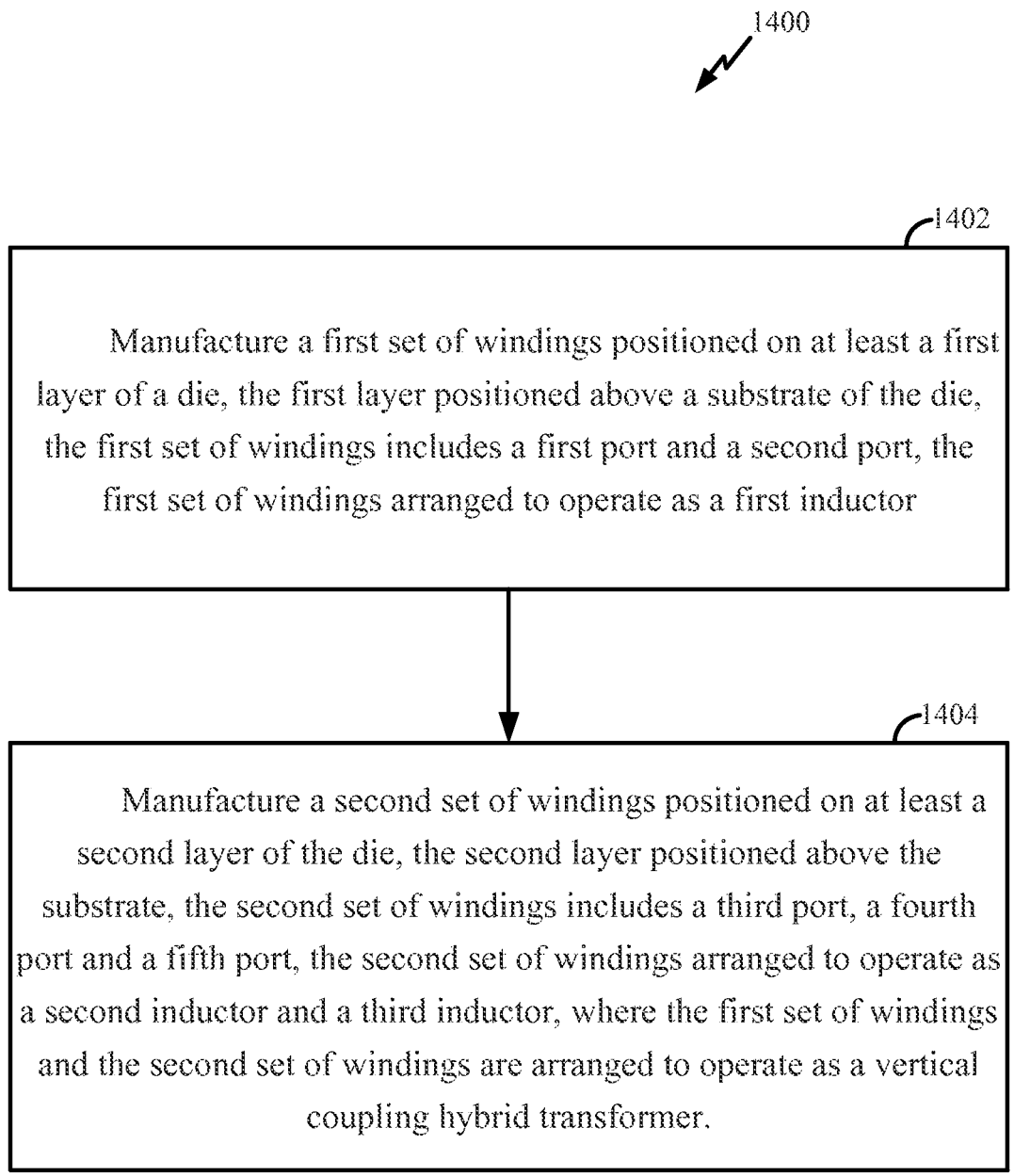
FIG. 14 illustrates a flow diagram of a general method for manufacturing a hybrid transformer.

Having described a detailed method for manufacturing a vertical coupling hybrid transformer, a general method for manufacturing a vertical coupling hybrid transformer will be described with reference to FIG. 14. Specifically, FIG. 14 illustrates a flow diagram of an overview of manufacturing a hybrid transformer. As shown in FIG. 14, the method manufactures (at 1402) a first set of windings positioned on at least a first layer of the die. The first layer is positioned above a substrate of the die. The first set of windings includes a first port and a second port. The first set of windings is arranged to operate as a first inductor.

Next, the method manufactures (at 1404) a second set of windings positioned on at least a second layer of the die. The second layer is positioned above the substrate. In some implementations, the second layer is above the first layer. In other implementations, the second layer is below the first layer. The second set of windings includes a third port, a fourth port and a fifth port. The second set of windings is arranged to operate as a second inductor and a third inductor. The first set of windings and the second set of windings are arranged to operate as a vertical coupling hybrid transformer.

Figure 15:
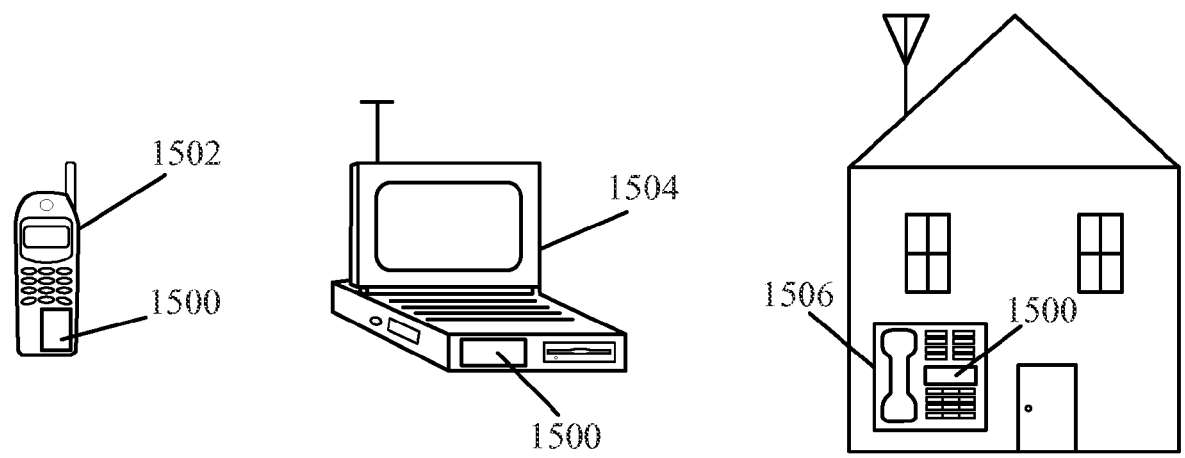
FIG. 15 illustrates various electronic devices that may integrate the IC or die described herein.

FIG. 15 illustrates various electronic devices that may be integrated with any of the aforementioned integrated circuit, die, chip or package. For example, a mobile telephone 1502, a laptop computer 1504, and a fixed location terminal 1506 may include an integrated circuit (IC) 1500 having a central thermal management unit. The IC 1500 may be, for example, any of the integrated circuits, dies or packages described herein. The devices 1502, 1504, 1506 illustrated in FIG. 15 are merely exemplary. Other electronic devices may also feature the IC 1500 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features, and/or functions illustrated in FIGS. 3, 4, 5, 6, 7, 8, 9, 10, 11, 12, 13, 14 and/or 15 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" may be used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die.

The term "energy coupling" may be used herein to refer to the direct or indirect energy transfer between two objects. Energy coupling may occur between two objects (e.g., circuits, wires) even if the objects are not physically touching. For example, energy coupling may occur between two objects A and B, even if there is an object C in between the two objects A and B. Energy coupling may refer to energy transfer from object A to object B or from object B to object A. Energy coupling may be referred to unidirectional or bi-directional energy transfer.

The terms wafer and substrate may be used herein to include any structure having an exposed surface with which to form an integrated circuit (IC) according to aspects of the present disclosure. The term die may be used herein to include an IC. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A hybrid transformer formed within a semiconductor die having multiple layers, the hybrid transformer comprising:
   a first set of windings positioned on at least a first layer of the semiconductor die, the first layer positioned above a substrate of the semiconductor die, the first set of windings includes a first port and a second port, the first set of windings arranged to operate as a first inductor; and
   a second set of windings positioned on at least a second layer of the semiconductor die, the second layer positioned above the substrate, the second set of windings includes a third port, a fourth port and a fifth port, the second set of windings arranged to operate as a second inductor and a third inductor, wherein the semiconductor die includes a third layer and a fourth layer, the first set of windings being positioned on the first layer and on the third layer, the second set of windings being positioned on the second layer and on the fourth layer, and wherein the first set of windings and the second set of windings are arranged to operate as a vertical coupling hybrid transformer.

2. The hybrid transformer of claim 1, wherein the first set of windings and the second set of windings arranged to operate as the vertical coupling hybrid transformer are configured to transfer energy between the first set of windings and the second set of windings, and wherein a majority of a total energy that is transferred between the first set of windings and the second set of windings occurs between windings on different layers of the semiconductor die.

3. The hybrid transformer of claim 1, wherein the first set of windings and the second set of windings arranged to operate as the vertical coupling hybrid transformer are configured to transfer energy between the first set of windings and the second set of windings, and wherein a substantial amount of a total energy that is transferred between the first set of windings and the second set of windings occurs between windings on different layers of the semiconductor die.

4. The hybrid transformer of claim 1. wherein the substrate is an insulative radio frequency (RF) substrate.

5. The hybrid transformer of claim 1, wherein the substrate is a glass substrate.

6. The hybrid transformer of claim 1, wherein the semiconductor die includes a dielectric layer located between the first set of windings and the second set of windings.

7. The hybrid transformer of claim 6, wherein the dielectric layer comprises a low k dielectric, a low-loss dielectric, or a combination thereof.

8. The hybrid transformer of claim 6, wherein the dielectric layer comprises a polyimide material, an acrylic material, a polybenzoxazole (PBO) material, a benzocyclobutene (BCB) material, or a combination thereof.

9. The hybrid transformer of claim 1, wherein the second layer is above the first layer.

10. The hybrid transformer of claim 1, wherein the first layer is above the second layer.

11. The hybrid transformer of claim 1, wherein the first set of windings is interleaved with the second set of windings on the multiples layers of the semiconductor die.

12. The hybrid transformer of claim 11, wherein a first portion of the first set of windings and a first portion of the second set of windings are positioned on the first layer, wherein a second portion of the first set of windings and a second portion of the second set of windings are positioned on the third layer, wherein a third portion of the first set of windings and a third portion of the second set of windings are positioned on the second layer, and wherein a fourth portion of the first set of windings and a fourth portion of the second set of windings are positioned on the fourth layer.

13. The hybrid transformer of claim 1, wherein the first set of windings includes a first set of conductive traces.

14. The hybrid transformer of claim 13, wherein the first set of windings includes a first set of interconnects.

15. The hybrid transformer of claim 1, wherein the first set of windings is symmetrical to the second set of windings.

16. The hybrid transformer of claim 1, wherein the second set of windings is positioned and aligned directly above the first set of windings.

17. The hybrid transformer of claim 1, wherein the first set of windings and the second set of windings are coaxial.

18. The hybrid transformer of claim 1, wherein the first set of windings has a first number of loops, and wherein the second set of windings has a second number of loops.

19. The hybrid transformer of claim 1, wherein the hybrid transformer operates as a signal duplexer.

20. The hybrid transformer of claim 1, wherein the first port is positioned on the first layer, the second port is positioned on the third layer, the third port is positioned on the second layer, the fourth port is positioned on the second layer or the fourth layer, and the fifth port is positioned on the fourth layer.

21. A method for manufacturing a hybrid transformer in a semiconductor die, the method comprising:

forming a first set of windings positioned on at least a first layer of the semiconductor die, the first layer positioned above a substrate of the die, the first set of windings includes a first port and a second port, the first set of windings arranged to operate as a first inductor; and forming a second set of windings positioned on at least a second layer of the semiconductor die, the second layer positioned above the substrate, the second set of windings includes a third port, a fourth port and a fifth port, the second set of windings arranged to operate as a second inductor and a third inductor, wherein the semiconductor die includes a third layer and a fourth layer, the first set of windings being positioned on the first layer and on the third layer, the second set of windings being positioned on the second layer and on the fourth layer, and wherein the first set of windings and the second set of windings are arranged to operate as a vertical coupling hybrid transformer.

22. The method of claim 21, wherein the first set of windings and the second set of windings arranged to operate as the vertical coupling hybrid transformer are configured to transfer energy between the first set of windings and the second set of windings, and wherein a majority of a total energy that is transferred between the first set of windings and the second set of windings occurs between windings on different layers of the semiconductor die.

23. The method of claim 21, wherein the first set of windings and the second set of windings arranged to operate as the vertical coupling hybrid transformer are configured to transfer energy between the first set of windings and the second set of windings, and wherein a substantial amount of a total energy that is transferred between the first set of windings and the second set of windings occurs between windings on different layers of the semiconductor die.

24. The method of claim 21, wherein the substrate is an insulative radio frequency (RF) substrate.

25. The method of claim 21, wherein the substrate is a glass substrate.

26. The method of claim 21, wherein a dielectric layer is positioned between the first set of windings and the second windings.

27. The method of claim 26, wherein the dielectric layer comprises a low k dielectric, a low-loss dielectric, or a combination thereof.

28. The method of claim 26, wherein the dielectric layer comprises a polyimide material, an acrylic material, a polybenzoxazole (PBO) material, a benzocyclobutene (BCB) material, or a combination thereof.

29. An apparatus for manufacturing a hybrid transformer in a die, the apparatus comprising:

means for manufacturing a first set of windings positioned on at least a first layer of the die, the first layer positioned above a substrate of the die, the first set of windings includes a first port and a second port, the first set of windings arranged to operate as a first inductor; and means for manufacturing a second set of windings positioned on at least a second layer of the die, the second layer positioned above the substrate, the second set of windings includes a third port, a fourth port and a fifth port, the second set of windings arranged to operate as a second inductor and a third inductor, wherein the die includes a third layer and a fourth layer, the first set of windings being positioned on the first layer and on the third layer, the second set of windings being positioned on the second layer and on the fourth layer, and wherein the first set of windings and the second set of windings are arranged to operate as a vertical coupling hybrid transformer.

30. The apparatus of claim 29, wherein the first set of windings and the second set of windings arranged to operate as the vertical coupling hybrid transformer are configured to transfer energy between the first set of windings and the second set of windings, and wherein a majority of a total energy that is transferred between the first set of windings and the second set of windings occurs between windings on different layers of the die.

31. The apparatus of claim 29, wherein the first set of windings and the second set of windings arranged to operate as the vertical coupling hybrid transformer are configured to transfer energy between the first set of windings and the second set of windings, and wherein a substantial amount of a total energy that is transferred between the first set of windings and the second set of windings occurs between windings on different layers of the die.

32. The apparatus of claim 29, wherein the substrate is an insulative radio frequency (RF) substrate.

33. The apparatus of claim 29, wherein the substrate is a glass substrate.

34. The apparatus of claim 29, further comprising means for depositing a dielectric layer between the first set of windings and the second windings.

35. The apparatus of claim 34, wherein the dielectric layer comprises a low k dielectric, a low-loss dielectric, or a combination thereof.

36. The apparatus of claim 34, wherein the dielectric layer comprises a polyimide material, an acrylic material, a polybenzoxazole (PBO) material, a benzocyclobutene (BCB) material, or a combination thereof.

37. A semiconductor die comprising:
a substrate;
multiple layers comprising a first layer, a second layer, a third layer, and a fourth layer; and
a hybrid transformer coupled to the substrate, the hybrid transformer comprising:
a first set of windings positioned on at least the first layer and the third layer of the semiconductor die, the first layer positioned above the substrate, the first set of windings includes a first port and a second port, the first set of windings arranged to operate as a first inductor; and
a second second set of windings positioned on at least the second layer and the fourth layer of the semiconductor die, the second layer positioned above the substrate, wherein the second set of windings includes a third port, a fourth port and a fifth port, the second set of windings arranged to operate as a second inductor and a third inductor, and wherein the first set of windings and the set of windings are arranged to operate as a vertical coupling hybrid transformer.

38. The semiconductor die of claim 37, wherein the first set of windings and the second set of windings arranged to operate as the vertical coupling hybrid transformer are configured to transfer energy between the first set of windings and the second set of windings, wherein a majority of a total energy that is transferred between the first set of windings and the second set of windings occurs between different layers of the die.

39. The semiconductor die of claim 37, wherein the first set of windings is interleaved with the second set of windings on the multiple layers.

40. The semiconductor die of claim 39, wherein a first portion of the first set of windings and a first portion of the second set of windings are positioned on the first layer, wherein a second portion of the first set of windings and a second portion of the second set of windings are positioned on the third layer, wherein a third portion of the first set of windings and a third portion of the second set of windings are positioned on the second layer, and wherein a fourth portion of the first set of windings and a fourth portion of the second set of windings are positioned on the fourth layer.

41. The semiconductor die of claim 37, wherein the substrate is a glass substrate.

42. The semiconductor die of claim 37, further comprising a dielectric layer between the first set of windings and the second set of windings.

43. A semiconductor die comprising:
a substrate;
multiple layers comprising a first layer, a second layer, a third layer, and a fourth layer, wherein the first layer and the second layer are positioned above the substrate; and
means for providing vertical energy coupling, the means includes:
first means for conducting current, wherein the first means for conducting current is positioned on the first layer and on the fourth layer, wherein the first means for conducting current includes a first port and a second port, and wherein the first means for conducting is arranged to operate as a first inductor; and
second means for conducting current, wherein the second means for conducting current is positioned on the second layer and the fourth layer, wherein the second means for conducting current includes a third port, a fourth port and a fifth port, the second means for conducting arranged to operate as a second inductor and a third inductor, and wherein the first means for conducting current and the second means for conducting current are arranged to provide vertical energy coupling.

44. The semiconductor die of claim 43, wherein the first means for conducting and the second means for conducting are arranged to transfer energy between the first means for conducting and the second means for conducting, wherein a majority of a total energy that is transferred between the first means for conducting and the second means for conducting occurs between different layers of the multiple layers.

45. The semiconductor die of claim 43, wherein the first means for conducting includes a first set of windings, and wherein the second means for conducting includes a second set of windings.

46. The semiconductor die of claim 45, wherein the first set of windings is interleaved with the second set of windings on the multiple layers.

47. The semiconductor die of claim 43, wherein the substrate is a glass substrate.

48. The semiconductor die of claim 45, further comprising a dielectric layer between the first set of windings and the second set of windings.

* * * * *